United States Patent
Blethen et al.

(10) Patent No.: US 11,635,170 B2
(45) Date of Patent: Apr. 25, 2023

(54) METHOD, SYSTEM, AND DEVICE FOR STORAGE AND DELIVERY OF PROCESS GAS FROM A SUBSTRATE

(71) Applicant: RASIRC, Inc., San Diego, CA (US)

(72) Inventors: Richard D. Blethen, Vista, CA (US); Jeffrey J. Spiegelman, San Diego, CA (US); Russell J. Holmes, San Diego, CA (US); Daniel Alvarez, Jr., Oceanside, CA (US); Jian Yang, San Diego, CA (US); Ericca Lynne Speed, San Diego, CA (US)

(73) Assignee: RASIRC, INC., San Diego, CA (US)

( * ) Notice: Subject to any disclaimer, the term of this patent is extended or adjusted under 35 U.S.C. 154(b) by 291 days.

(21) Appl. No.: 16/764,308

(22) PCT Filed: Nov. 16, 2018

(86) PCT No.: PCT/US2018/061478
§ 371 (c)(1),
(2) Date: May 14, 2020

(87) PCT Pub. No.: WO2019/099797
PCT Pub. Date: May 23, 2019

(65) Prior Publication Data
US 2020/0393086 A1   Dec. 17, 2020

Related U.S. Application Data

(60) Provisional application No. 62/587,759, filed on Nov. 17, 2017, provisional application No. 62/651,589, (Continued)

(51) Int. Cl.
*F17C 11/00* (2006.01)
*B01D 15/00* (2006.01)
(Continued)

(52) U.S. Cl.
CPC .............. *F17C 11/00* (2013.01); *B01D 15/00* (2013.01); *B01D 19/0005* (2013.01);
(Continued)

(58) Field of Classification Search
CPC .... B01B 1/005; B01D 15/00; B01D 19/0005; B01D 3/10; B01D 3/346; C23C 16/45561;
(Continued)

(56) References Cited

U.S. PATENT DOCUMENTS

| 3,514,963 A | 6/1970 | Reimschuessel et al. |
| 4,744,221 A | 5/1988 | Knollmueller |

(Continued)

FOREIGN PATENT DOCUMENTS

| JP | 2001-315118 A | 11/2001 |
| JP | 2004-359916 A | 12/2004 |
| WO | 2010115884 A1 | 10/2010 |

OTHER PUBLICATIONS

EP18877730.4 Extended European Search Report dated Jul. 14, 2021.
(Continued)

*Primary Examiner* — Frank M Lawrence, Jr.
(74) *Attorney, Agent, or Firm* — Wagenknecht IP Law Group PC

(57) ABSTRACT

Provided herein are methods, systems, and devices incorporating use of materials to store, ship, and deliver process gases to micro-electronics fabrication processes and other critical process applications.

33 Claims, 16 Drawing Sheets

Related U.S. Application Data filed on Apr. 2, 2018, provisional application No. 62/665,168, filed on May 1, 2018.

(51) Int. Cl.

| | | |
|---|---|---|
| *B01D 19/00* | (2006.01) | |
| *B01J 20/26* | (2006.01) | |
| *B01J 20/28* | (2006.01) | |
| *C23C 16/455* | (2006.01) | |

(52) U.S. Cl.
CPC ....... *B01J 20/261* (2013.01); *B01J 20/28033* (2013.01); *B01J 20/28047* (2013.01); *B01J 20/28061* (2013.01); *B01J 20/28064* (2013.01); *C23C 16/45561* (2013.01); *F17C 2201/0109* (2013.01); *F17C 2227/045* (2013.01)

(58) Field of Classification Search
CPC ................ B01J 20/261; B01J 20/28033; B01J 20/28047; B01J 20/28061; B01J 20/28064; F17C 11/00; F17C 11/005; F17C 2201/0109; F17C 2227/045
USPC ......... 95/90, 255; 239/1, 236; 222/1, 3, 187, 222/630; 207/0.6, 0.7
See application file for complete search history.

(56) References Cited

U.S. PATENT DOCUMENTS

| | | | |
|---|---|---|---|
| 4,804,527 A | 2/1989 | Tatarchuck et al. | |
| 5,306,345 A | 4/1994 | Pellet et al. | |
| 5,518,528 A | 5/1996 | Tom et al. | |
| 5,980,608 A * | 11/1999 | Dietz | F17C 11/00 96/111 |
| 5,985,008 A | 11/1999 | Tom et al. | |
| 6,019,823 A | 2/2000 | Tischler et al. | |
| 6,204,180 B1 | 3/2001 | Tom et al. | |
| 2005/0023365 A1* | 2/2005 | Lord | F17C 11/00 237/81 |
| 2007/0217967 A1* | 9/2007 | McDermott | F17C 11/00 422/168 |
| 2008/0302246 A1* | 12/2008 | Carruthers | F17C 11/00 428/307.3 |
| 2010/0293927 A1* | 11/2010 | Johannessen | B01D 53/79 137/12 |
| 2012/0315837 A1* | 12/2012 | Olander | F17C 11/00 454/340 |
| 2015/0068611 A1 | 3/2015 | Alvarez, Jr. et al. | |
| 2016/0333477 A1 | 11/2016 | Nehlsen et al. | |
| 2017/0029949 A1 | 2/2017 | Levy | |
| 2017/0216738 A1 | 8/2017 | Alvarez, Jr. et al. | |
| 2017/0239592 A1 | 8/2017 | Spiegelman et al. | |
| 2017/0271176 A1 | 9/2017 | Sasaki et al. | |
| 2018/0127272 A1* | 5/2018 | Shimizu | B01J 20/28061 |

OTHER PUBLICATIONS

PCT/US2018/061478 International Search Report and Written Opinion dated Mar. 4, 2019.
Olander et al. "Subatmospheric gas storage and delivery: Past, present and future," Semiconductor Digest, Jun. 2014, 1-5 [Retrieved from Internet] https://sst.semiconductor-digest.com/2014/06/subatmospheric-gas-storage-and-delivery-past-present-and-future/.
JP2020-527097 Office Action in Japan Drafted Dec. 4, 2022 and dated Jan. 10, 2023.

* cited by examiner

55 GSM, Spunlace, Lyocel/PET Vapor Output at 35°C/500sccm N₂

55 GSM, Spunlace, Lyocel/PET Vapor Output at 35°C/500sccm N₂

METHOD, SYSTEM, AND DEVICE FOR STORAGE AND DELIVERY OF PROCESS GAS FROM A SUBSTRATE

CROSS REFERENCE TO RELATED APPLICATION(S)

This application is a US national phase application under 35 U.S.C. § 371 of international patent application no. PCT/US2018/061478, filed Nov. 16, 2018, which claims the benefit of priority under 35 U.S.C. § 119(e) of U.S. Ser. No. 62/587,759, filed Nov. 17, 2017, of U.S. Ser. No. 62/651,589, filed Apr. 2, 2018, and of U.S. Ser. No. 62/665,168, filed May 1, 2018. The entire content of each of which is incorporated herein by reference.

BACKGROUND OF THE INVENTION

Field of the Invention

The invention relates generally to process gases, and more specifically, to the use of materials to store, ship, and deliver process gases to micro-electronics fabrication and other critical process applications.

Background Information

Various process gases may be used in the manufacturing and processing of micro-electronics. In addition, a variety of chemicals may be used in other environments demanding high purity gases, e.g., critical processes or applications, including without limitation microelectronics applications, wafer cleaning, wafer bonding, photoresist stripping, silicon oxidation, surface passivation, surface nitridation, photolithography mask cleaning, atomic layer deposition, chemical vapor deposition, flat panel displays, disinfection of surfaces contaminated with bacteria, viruses, DNA, and other biological agents, industrial parts cleaning, pharmaceutical manufacturing, production of nano-materials, power generation and control devices, fuel cells, power transmission devices, and other applications in which process control and purity are critical considerations. In those processes and applications, it is necessary to deliver specific amounts of certain process gases under controlled operating conditions, e.g., temperature, pressure, and flow rate.

For a variety of reasons, gas phase delivery of process chemicals is preferred to liquid phase delivery. For applications requiring low mass flow for process chemicals, liquid delivery of process chemicals is not accurate or clean enough. Gaseous delivery would be desired from a standpoint of ease of delivery, accuracy, and purity. Gas flow devices are better attuned to precise control than liquid delivery devices. Additionally, micro-electronics applications and other critical processes typically have extensive gas handling systems that make gaseous delivery considerably easier than liquid delivery. One approach is to vaporize the process chemical component directly at or near the point of use. Vaporizing liquids provides a process that leaves heavy contaminants behind, thus purifying the process chemical. However, for safety, handling, stability, and/or purity reasons, many process gases are not amenable to direct vaporization.

Ozone is a gas that is typically used to clean the surface of semiconductors (e.g., photoresist stripping) and as an oxidizing agent (e.g., forming oxide or hydroxide layers). More recently, hydrogen peroxide has been explored as a replacement for ozone in certain applications. However, hydrogen peroxide has been of limited utility because highly concentrated hydrogen peroxide solutions present serious safety and handling concerns and obtaining high concentrations of hydrogen peroxide in the gas phase has not been possible using existing technology. Hydrogen peroxide is typically available as an aqueous solution. In addition, because hydrogen peroxide has a relatively low vapor pressure (boiling point is approximately 150° C.), available methods and devices for delivering hydrogen peroxide generally do not provide hydrogen peroxide containing gas streams with a sufficient concentration of hydrogen peroxide.

Hydrazine has been widely used as rocket fuel, and its properties of being highly explosive, highly reactive, and highly toxic are well known (Eckart Walter Schmidt, Hydrazine and Its Derivatives: Preparation, Properties, Applications, 2nd Edition, Wiley-Interscience, 2001). Early studies have shown the potential viability of Hydrazine ($N_2H_4$) and its derivatives as a low temperature nitrogen source in chemistry vapor deposition (CVD) and atomic layer deposition (ALD). Thus, hydrazine presents an opportunity to explore lower temperatures in part because of the favorable thermodynamics of hydrazine resulting in lower deposition temperatures and a spontaneous reaction to form nitrides. Although reported in the literature (Burton et al. J. Electrochem. Soc., 155(7) 0508-0516 (2008)), hydrazine usage has not been adopted commercially due to significant safety concerns with using hydrazine.

As explained in International Publication Nos. WO2016/065132 and WO2017/181013, and PCT App. No. PCT/US2018/022686 by Rasirc, Inc., which are incorporated by reference herein, the gas phase use of process chemicals has been limited by safety, handling, and purity concerns. Since the gas phase of many of such process chemicals have low flash points and can be explosive, semiconductor industry protocols for safe handling of these materials are very limited. Thus, a need exists for the safe packing, shipping, storing, and usage of process gases.

SUMMARY OF THE INVENTION

The invention relates generally to process gases and more specifically to the use of materials, such as porous materials, to store, ship, and deliver process gases to micro-electronics fabrication and other critical process applications. Accordingly, in one aspect, the invention provides a solid storage device for a process solution. The storage device includes a housing with a substrate disposed therein; a process solution contained within the housing and in fluid contact with the substrate such that the solution is adsorbed onto the substrate, thereby diluting the solution within the substrate; and a head space contained within the housing and separated from the process solution by the substrate. In various embodiments, the housing is configured to allow a carrier gas to flow through the head space or is configured to allow a vacuum to be drawn through the head space to produce a gas stream comprising a gas phase of the process solution to deliver the gas stream to a critical process, application or storage vessel. In certain embodiments, the quantity of the process solution in the device is about 30 to 1900 weight percent of the process solution/substrate complex. In certain embodiments, the quantity of the process solution in the device is about 30 to 800 weight percent of the process solution/substrate complex. In certain embodiments, the quantity of the process solution in the device is about 30 to 100 weight percent of the process solution/substrate complex.

In various embodiments, the process solution is selected from a group consisting of hydrogen peroxide, hydrazine, mono-methyl hydrazine, tertiary butyl hydrazine, dimethylhydrazine, and any derivative thereof. In various embodiments, the process solution is a liquid solution or a gaseous solution, such as an aqueous hydrogen peroxide solution, an anhydrous hydrogen peroxide solution, an aqueous hydrazine solution, or an anhydrous hydrazine solution. In various embodiments, the anhydrous hydrogen peroxide solution or anhydrous hydrazine solution contains less than 2%, 0.5%, 0.1%, 0.01%, 0.001%, 0.0001% or 0.00001% water.

In various embodiments, the substrate is a porous structure with a surface area ranging from 100 to 1000 $m^2/g$. In various embodiments, the various is configured to adsorb over 42% w/w hydrogen peroxide. In various embodiments, the substrate is configured to adsorb over 50% w/w hydrogen peroxide. In various embodiments, the concentration of the hydrogen peroxide solution is over 100% w/w. In various embodiments, the concentration of the hydrogen peroxide solution is over 200% w/w. In various embodiments, the concentration of hydrogen peroxide is over 800% w/w. In various embodiments, the concentration of hydrogen peroxide is over 1000% w/w. In various embodiments, the concentration of hydrogen peroxide is over 1900% w/w. In various embodiments, the concentration of the hydrogen peroxide solution is below 30% w/w. In various embodiments, the concentration of the hydrogen peroxide solution is stable over a course of a known period of time, such as no less than approximately 100 hours.

In certain embodiments, wherein the substrate is formed as a fabric, a powder, one or more bricks, one or more blocks, one or more beads, one or more particles, one or more extrudates, or one or more pellets. In certain embodiments, the substrate is a non-woven fabric that has been treated with a mechanical finishing process selected from the group consisting of spun bonding, needle bonding, perforation bonding, carding, and any combination thereof. In certain embodiments, the non-woven fabric is a PTFE fabric. In certain embodiments, the substrate is formed as a mesh.

In certain embodiments, the substrate is formed from a material selected from the group consisting of alumina, aluminum oxide, titanium dioxide, silica, silicon dioxide, quartz, activated carbon, carbon molecular sieve, carbon pyrolyzate, polytetrafluoroethylene (PTFE), polyester (PE), polyethylene terephthalate (PET), polyethylene/polyethylene terephthalate co-polymer, polypropylene (PP), rayon, zirconium oxide, zeolite, high silica zeolite, polymethylpentene (PMP), polybutylene terephthalate (PBT), polyethylene/polypropylene co-polymers, Hydrophilic High Density Polyethylene (HDPE), Hydrophobic High Density Polyethylene (HDPE), Hydrophilic UHMW Polyethylene, Hydrophobic UHMW Polyethlyene, perfluoroalkoxy alkane (PFA), polyvinylidene fluoride (PVF), silk, tencel, sponge materials, polyethylene glycol (PEG), polyvinyl alcohol (PVA), and/or polyvinylpyrrolidone (PVP), polypyridine, polyacrylates, polyacrylic acid, polyacrylic acid/acrylate co-polymers, polycarbonates, polyacrylamides, polyacrylate/acrylamide co-polymers, cellulosic materials, and any combination thereof. In various embodiments, the mesh substrate is spiral-wound within the housing.

In various embodiments, the storage device includes a separator disposed adjacent to the mesh, wherein the separator is configured to support and separate layers of the spiral-wound mesh. In certain embodiments, the separator is formed from PTFE.

In various embodiments, the substrate is a hydrogel selected from the group consisting of polyethylene glycol (PEG), polyvinyl alcohol (PVA), polyvinylpyrrolidone (PVP), polypyridine, and any combination thereof. In various embodiments, the hydrogel is a 20% PEG hydrogel or a 40% PEG hydrogel. In certain embodiments, the hydrogel is wrapped in a PTFE mesh and/or may further include a separator disposed adjacent to the mesh.

In another aspect, the invention provides a method for delivering a gas. The method includes contacting a process solution with a substrate within an enclosed housing such that the solution is adsorbed onto the substrate, thereby diluting the process solution within the substrate; exposing the substrate to a carrier gas or a vacuum, thereby forming a gas stream comprising a gas phase of the process solution; and delivering the gas stream to a critical process, application, or storage vessel. The housing may be configured to allow the carrier gas to flow through a head space contained within the housing or is configured to allow vacuum to be drawn through the head space, and the head space may be separated from the process solution by the substrate.

In another aspect, the invention provides a chemical delivery system. The system may include a process solution provided within a housing, wherein the process solution is in contact with a substrate disposed within the housing such that the solution is adsorbed onto the substrate, thereby diluting the process solution within the substrate. The chemical delivery system may also include a carrier gas or vacuum in fluid contact with the gas phase in the head space of the process solution, thereby forming a transportable gas stream within the head space. The chemical delivery system may further include an apparatus in fluid communication with the housing and used for delivering the gas stream to a critical process, application or storage vessel. In various embodiments, the housing allows the carrier gas to flow through a head space contained within the housing or allows vacuum to be drawn through the head space.

The methods and systems provided herein may further comprise use of various components for containing and controlling the flow of the gases and liquids used therein. For example, the methods and systems may include one or more mass flow controllers, valves, check valves, filters, pressure gauges, gas sensors, regulators, rotameters, and pumps. The methods and systems provided herein may also include various heaters, thermocouples, and temperature controllers to control the temperature of various components of the systems and steps of the methods.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the embodiments and claims.

It is to be understood that both the foregoing general description and the following detailed description are exemplary and explanatory only and are not restrictive of the invention.

The accompanying drawings, which are incorporated in and constitute a part of this specification, illustrate several embodiments of the invention and, together with the description, serve to explain the principles of the invention.

BRIEF DESCRIPTION OF THE DRAWINGS

Embodiments of the present disclosure and their advantages are best understood by referring to the detailed description that follows. It should be appreciated that like reference numerals are used to identify like elements illustrates in one or more of the figures.

DETAILED DESCRIPTION OF THE INVENTION

Figure 1:
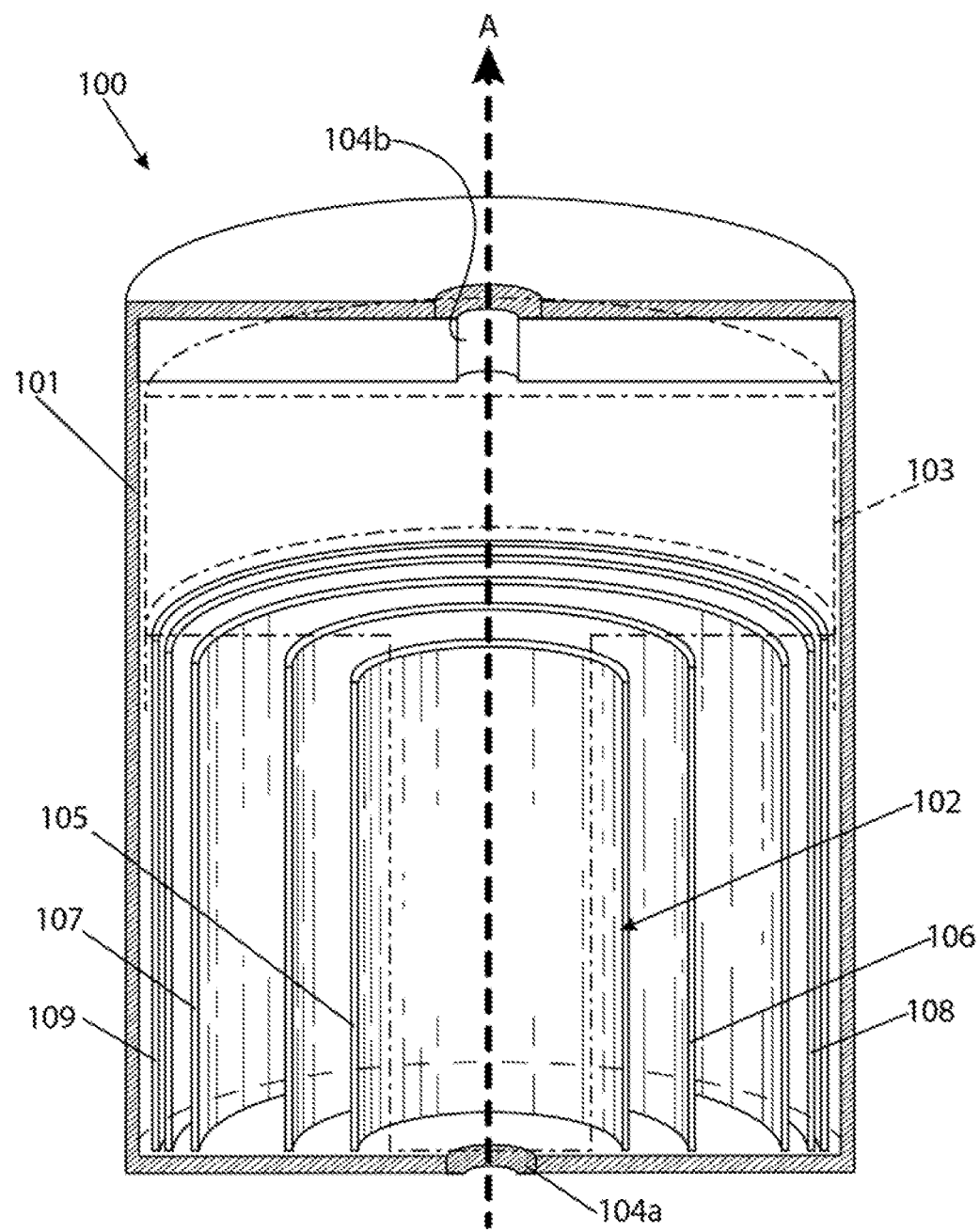
FIG. 1 is a pictorial diagram showing a perspective cross-sectional view of an exemplary embodiment of a storage device according to the present invention.

New generation semiconductor materials and architectures require new precursors and oxidants for atomic layer deposition (ALD), atomic layer etch (ALE), and chemical vapor deposition (CVD) processes. Many liquid process chemical solutions used in these processes have the possibility of leakage when a typical storage container containing the solution ruptures or other system components fail under pressure, impact, or heat. For example, hydrazine leaked into the environment can present an explosion, fire, or physical hazard to those exposed. The present invention is therefore based on the observation that materials, such as, for example, porous materials, may be used to store, ship, and deliver process gases for micro-electronics fabrication and other critical process applications while obviating the hazards posed by typical storage containers.

Before the present compositions and methods are described, it is to be understood that this invention is not limited to particular compositions, configurations, methods, and experimental conditions described, as such compositions, configurations, methods, and conditions may vary. It is also to be understood that the terminology used herein is for purposes of describing particular embodiments only, and is not intended to be limiting, since the scope of the present invention will be limited only in the appended claims.

As used in this specification and the appended claims, the singular forms "a", "an", and "the" include plural references unless the context clearly dictates otherwise. Thus, for example, references to "the method" includes one or more methods, and/or steps of the type described herein which will become apparent to those persons skilled in the art upon reading this disclosure and so forth.

The term "comprising," which is used interchangeably with "including," "containing," or "characterized by," is inclusive or open-ended language and does not exclude additional, unrecited elements or method steps. The phrase "consisting of" excludes any element, step, or ingredient not specified in the claim. The phrase "consisting essentially of" limits the scope of a claim to the specified materials or steps and those that do not materially affect the basic and novel characteristics of the claimed invention. The present disclosure contemplates embodiments of the invention compositions and methods corresponding to the scope of each of these phrases. Thus, a device, composition or method comprising recited elements or steps contemplates particular embodiments in which the composition or method consists essentially of or consists of those elements or steps.

"About" as used herein means that a number referred to as "about" comprises the recited number plus or minus 1-10% of that recited number. For example, "about" 100 degrees can mean 95-105 degrees or as few as 99-101 degrees depending on the context. Whenever it appears herein, a numerical range such as "1 to 20" refers to each integer in the given range; i.e., meaning only 1, only 2, only 3, etc., up to and including only 20.

Unless defined otherwise, all technical and scientific terms used herein have the same meaning as commonly understood by one of ordinary skill in the art to which this invention belongs. Although any methods and materials similar or equivalent to those described herein can be used in the practice or testing of the invention, the preferred methods and materials are now described.

The term "process gas" as used herein is a broad term, and is to be given its ordinary and customary meaning to a person of ordinary skill in the art (and is not to be limited to a special or customized meaning), and refers without limitation to a gas that is used in an application or process, e.g., a step in the manufacturing or processing of micro-electronics and in other critical processes. Exemplary process gases are reducing agents, oxidizing agents, inorganic acids, organic acids, inorganic bases, organic bases, and inorganic and organic solvents. Specific examples of process gases include, but are not limited to, hydrazine and hydrogen peroxide.

The term "reactive process gas" as used herein is a broad term, and is to be given its ordinary and customary meaning to a person of ordinary skill in the art (and is not to be limited to a special or customized meaning), and refers without limitation to a process gas that chemically reacts in the particular application or process in which the gas is employed, e.g., by reacting with a surface, a liquid process chemical, or another process gas.

The term "non-reactive process gas" as used herein is a broad term, and is to be given its ordinary and customary meaning to a person of ordinary skill in the art (and is not to be limited to a special or customized meaning), and refers without limitation to a process gas that does not chemically react in the particular application or process in which the gas is employed, but the properties of the "non-reactive process gas" provide it with utility in the particular application or process.

The term "carrier gas" as used herein is a broad term, and is to be given its ordinary and customary meaning to a person of ordinary skill in the art (and is not to be limited to a special or customized meaning), and refers without limitation to a gas that is used to carry another gas through a process train, which is typically a train of piping. Exemplary carrier gases are nitrogen, argon, hydrogen, oxygen, $CO_2$, clean dry air, helium, ammonia, or other gases that are stable at room temperature and atmospheric pressure. In various embodiments, the carrier gas may be a substantially dry carrier gas.

The term "head space" as used herein is a broad term, and is to be given its ordinary and customary meaning to a person of ordinary skill in the art (and is not to be limited to a special or customized meaning), and refers without limitation to a volume of gas in fluid contact with a process chemical solution (e.g., hydrazine) that provides at least a portion of the vapor phase (i.e., process gas) contained in the head space. There may be a permeable or selectively permeable barrier wholly or partially separating the head space that is optionally in direct contact with the process chemical solution. In those embodiments where the membrane is not in direct contact with the process chemical solution, more than one head space may exist, i.e., a first head space directly above the solution that contains the vapor phase of the solution and a second head space separated from the first head space by a membrane that only contains the components of the first head space that can permeate the membrane, e.g., hydrazine. In those embodiments with a hydrazine solution and a head space separated by a substantially gas-impermeable membrane, the head space may be located above, below, or on any side of the chemical solution, or the head space may surround or be surrounded by the hydrazine solution. For example, the head space may be the space inside a substantially gas-impermeable tube running through the hydrazine solution or the hydrazine solution may be located inside a substantially gas-impermeable tube with the head space surrounding the outside of the tube. The head space is also the space surrounding the substrate in which the chemical solution is present in the gas phase in a manner that allows for transport to critical processes by way of carrier gas or vacuum.

As provided herein, the storage device of the present invention may be implemented to act as a storage, shipping, and dispensing mechanism for process gases and solutions that may be dispensed as a controlled, high-purity vapor for use in various applications, such as micro-electronics applications. In various embodiments, the substrate may have inert chemistry properties, porous structures with large surface areas and high surface to volume ratios, and solid or semi-solid morphology. As such, the substrate significantly improves the safety of process gases, such as anhydrous hydrazine or hydrogen peroxide, during packing, shipping, storing, and using, and produce a high and stable output of the process gas vapor with a high purity.

Compared to known storage vessels used for anhydrous hydrazine gas and liquid hydrazine solutions containing other solvents, the present invention provides a storage device incorporating a substrate configured to adsorb the process chemical solution, thereby providing the following advantages: (1) by turning the morphology of, e.g., hydrazine from liquid into "solid," the complex minimizes the dangerous level of leakage should the storage device rupture and/or other system components fail (for example, failure of valves, joints, etc.); (2) the inert absorbent/adsorbent materials used to form the substrate have good compatibility with anhydrous hydrazine such that no volatile or small molecules are produced during the storage and usage thereof (this also improves safety while minimizing the amount of contaminants in the hydrazine vapor phase); (3) by not using a liquid solvent, the output of anhydrous hydrazine from the storage device is not affected by other volatile components in the vessel due to changes in concentration of the hydrazine, which follows Raoult's law (thereby improving stability of the hydrazine vapor output); and (4) the hydrazine/adsorbent has a large surface area for the vaporizing anhydrous hydrazine, as compared to liquid hydrazine, resulting in stable, high hydrazine vapor output. U.S. Pat. Nos. 9,610,550 and 9,410,191, incorporated herein by reference, describe methods of delivering clean and dry gas from multiple components solution.

Referring now to the drawings, wherein the showings are for the purpose of illustrating embodiments and presenting experimental values of the present invention only and not for purposes of limiting the same, FIG. 1 shows a perspective cross-sectional view of an exemplary storage device 100 with a substrate 102 disposed therein in accordance with one or more embodiments of the present disclosure.

As shown in FIG. 1, storage device 100 can include a housing 101 with a head space 103 defined therein. Substrate 102 (also referred to herein as a "wick material" and "wick reservoir") may be disposed within housing 101 of storage device 100. In various embodiments, the vapor phase of a process solution (e.g. hydrazine solution or hydrogen peroxide solution) provided within the housing will be produced in the head space 103 of storage device 100 such that the vapor phase may then be adsorbed onto the surface of the substrate 102 to dilute the process solution within the substrate. The housing 101 may be configured to allow a carrier gas (e.g., a dry carrier gas) to flow through the head space 103, or to allow a vacuum to be drawn through the head space 103, for example, through inlet port 104a and outlet port 104b of housing 101 to produce a gas stream containing the gas phase substantially along axis A. In various embodiments, head space 103 contained within housing 101 may be separated from the process solution (e.g., hydrazine solution or hydrogen peroxide solution) by substrate 102. While an exemplary housing 101 is shown as a tubular housing that has opposing inlet/outlet ports 104a/104b, it should be understood that housing 101 may be formed in any shape suitable for storage and/or delivery of the gas stream to a critical process, application, or other storage vessel.

Figure 2:
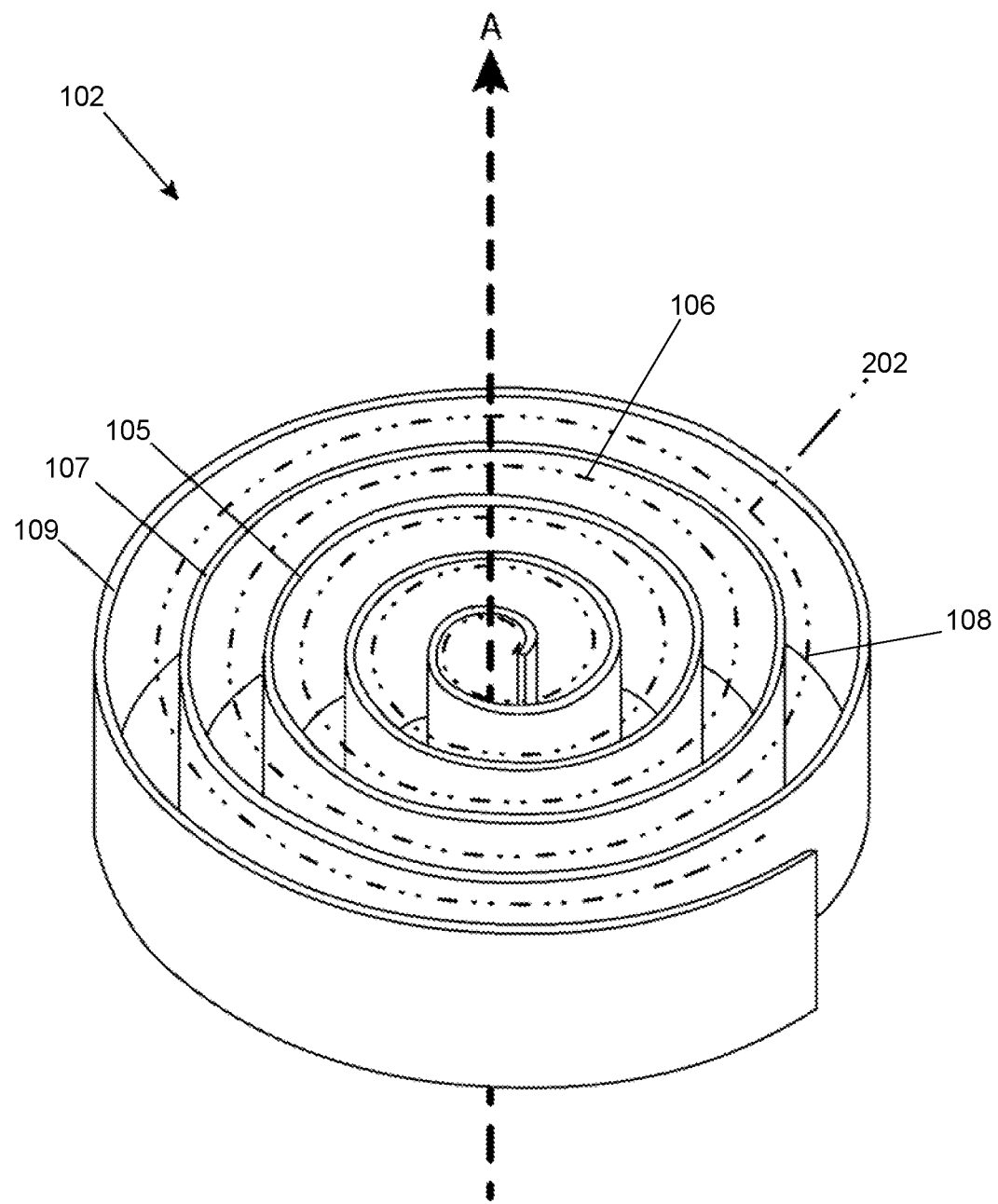
FIG. 2 is a pictorial diagram showing a perspective view of a spiral-wound substrate of the storage device according to various embodiments of the present invention.

In various embodiments of the present disclosure, the substrate may be spiral-wound (e.g., a continuous, helical form with one or more layers, as shown in FIG. 2). In other embodiments, the substrate may be cut into individual layers, which may be arranged as substantially concentric cylinders within the housing. As shown in FIG. 2, substrate 102 may have one or more layers (e.g., layers 105, 107, and 109). Layers (105, 107, 109) may be disposed in housing 101 as a spiral or may be disposed in substantially cylindrical layers about axis A of housing 101. In various embodiments, substrate 102 may be formed as a mesh, a woven fabric, or a non-woven fabric, and may have been treated with a mechanical finishing process, such as spun bonding, needle bonding, perforation bonding, carding, or any combination thereof. In various embodiments, the substrate may be surface treated to make the surface hydrophilic and/or enhance the capillary effect. In various embodiments, the surface treatment includes, but is not limited to, exposure to ozone, plasma, oxygen treatments and/or other chemical modification treatments.

In other embodiments, the morphology of the substrate (e.g., adsorbent or absorbent porous material) can be monolithic or divided forms, such as one or more bricks, one or more blocks, a powder, one or more beads, one or more particles, one or more pellets, one or more extrudates, etc., and may be formed from a porous absorbent/adsorbent material having a large surface area for increased absorption/adsorption of the process solution to thereby dilute the process solution within the substrate. In various embodiments, the substrate is a porous structure with a surface area ranging from about 100 $m^2/g$ to about 1000 $m^2/g$, such that the substrate is configured to adsorb over 30% w/w hydrogen peroxide, such as over 50% w/w hydrogen peroxide, over 100% w/w hydrogen peroxide, over 200% w/w hydrogen peroxide, over 800% w/w hydrogen peroxide, 1000% w/w hydrogen peroxide, or 1900% w/w hydrogen peroxide.

Exemplary substrates include, but are not limited to, activated carbon and porous metal oxides such as aluminum oxide, titanium dioxide, silica, zirconium oxide, and zeolite. Additional substrates may include, but are not limited to, polyolefins such as polyethylene (PE), polypropylene (PP), and polymethylpentene (PMP). Additional substrates may include, but are not limited to, polyesters such as polyethylene terephthalate (PET) and polybutylene terephthalate (PBT), polyethylene/polyethylene terephthalate co-polymer (PE/PET), polyethylene/polypropylene co-polymers, Hydrophilic High Density Polyethylene (HDPE), Hydrophobic High Density Polyethylene (HDPE), Hydrophilic UHMW Polyethylene, and Hydrophobic UHMW Polyethlyene. Additional exemplary substrates may include, but are not limited to, polycarbonate and polysulfone fluoropolymers such as polytetrafluoroethylene (PTFE), perfluoroalkoxy alkane (PFA), and polyvinylidene fluoride (PVF). Additional exemplary substrates may include, but are not limited to, natural polymeric materials such as rayon, silk, tencel, and sponge materials. Additional exemplary substrates may include, but are not limited to, alumina, silicon dioxide, quartz, carbon molecular sieve, carbon pyrolyzate, high silica zeolite, polypyridine, polyacrylates, polyacrylic acid, polyacrylic acid/acrylate co-polymers, polyacrylamides, polyacrylate/acrylamide co-polymers, cellulosic materials, etc. In various embodiments, the substrate 102 is formed as a non-woven fabric, such as a PTFE fabric.

Figure 3:
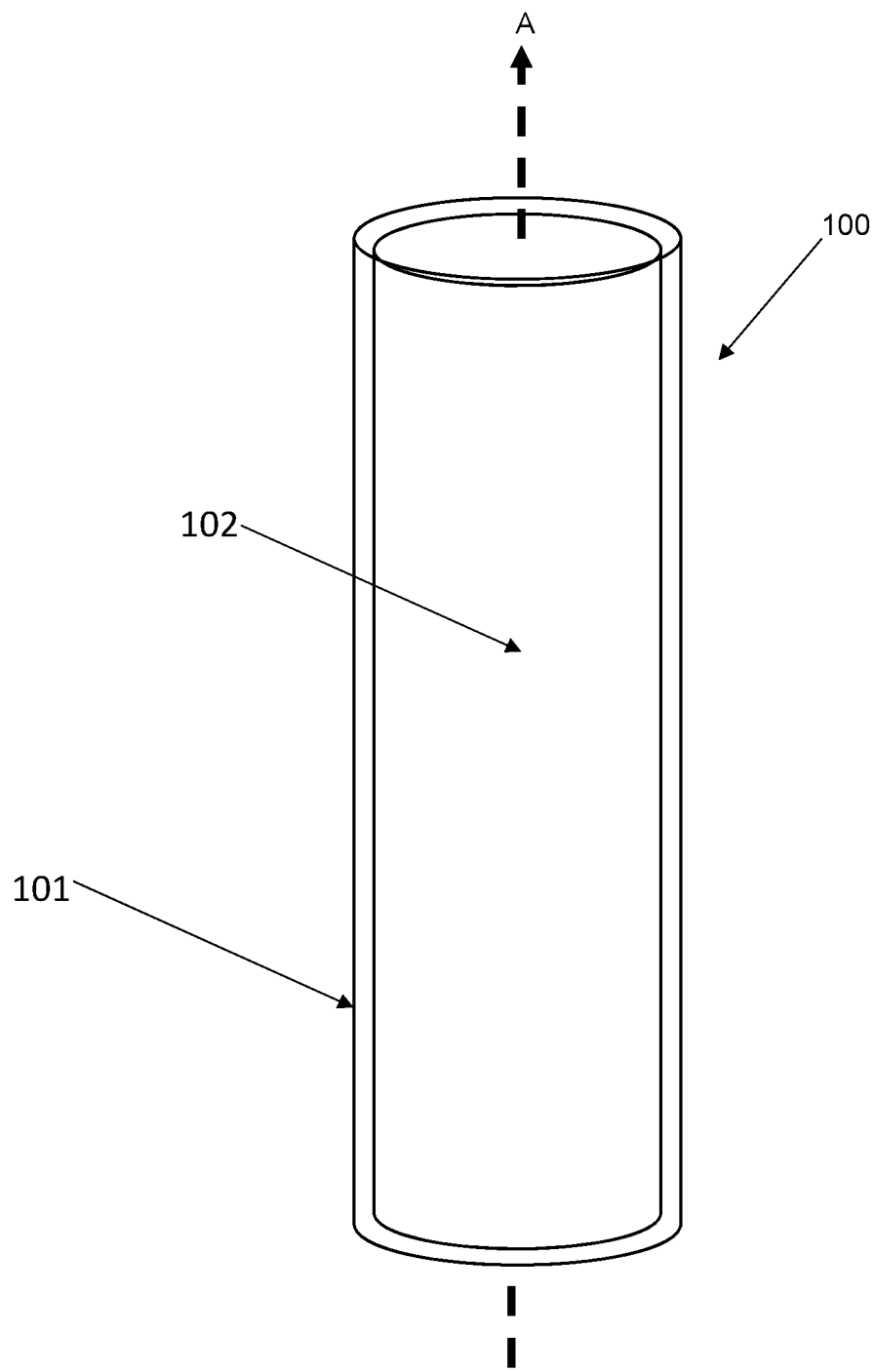
FIG. 3 is a pictorial diagram showing a perspective view of an exemplary embodiment of a storage device according to the present invention.

In other embodiments, substrate 102 may be a hydrogel configured to absorb/adsorb the process solution thereon, as shown in FIG. 3. As used herein, the term "hydrogel" is used broadly to refer to a macromolecular polymer gel constructed of a three-dimensional (3D) network of hydrophilic polymeric materials that can absorb a large amount water or other aqueous solutions. Most of the hydrogel materials have a cross-linked structure so they can maintain their 3D network, even when they are dry. Without being bound by theory, hydrogels are typically synthesized from hydrophilic monomers by either chain or step growth, along with a functional crosslinker to promote network formation. Exemplary hydrogels useful as a substrate 102 of the storage device 100 provided herein include, but are not limited to, polyethylene glycol (PEG), polyvinyl alcohol (PVA), polyvinylpyrrolidone (PVP), polypyridine, or any combination thereof. In one or more embodiments, substrate 102 may be a 20% or 40% PEG hydrogel. For example, PEG hydrogel is an inert, highly hydrophilic, absorbent material that can retain anhydrous hydrogen peroxide and give an output of anhydrous hydrogen peroxide vapor of more than 1500 ppm in a 500 sccm nitrogen flow at 35° C. Significantly, no decomposition was observed when treating PEG hydrogel with anhydrous hydrogen peroxide for 24 hours.

Using such polymeric materials as a reservoir of a process gas minimizes the possibility of having entrained liquid droplets in the gas stream being delivered. As such, dry PEG hydrogel is suitable for use as a substrate based on compatibility, absorbance and retention with various process solutions. PEG has hydrophilic chains and can combine with water and, e.g., hydrogen peroxide with hydrogen bonds. As such, without being bound by theory, the retention rate of, e.g., hydrogen peroxide, is dependent on the density of the PEG chains in its 3D network (i.e., the ratio of the mass and the volume of the dry gel) which is tailorable by adjusting the concentration of PEG molecules in water before drying. Thus, the ratio of the mass and the volume of dry gel may be varied depending on the content of the anhydrous hydrogen peroxide to be stored/delivered by the storage device.

In various embodiments, the hydrogel substrate 102 may be wrapped in a woven or non-woven mesh, such as a PTFE mesh. In various embodiments, the substrate may be surface treated to make the surface hydrophilic and/or enhance the capillary effect. In various embodiments, the surface treatment includes, but is not limited to, exposure to ozone, plasma, oxygen treatments and/or other chemical modification treatments.

In various embodiments, one or more separators (e.g., separators 106, 108) may be disposed adjacent to substrate 102 within the housing 101. For example, each separator (106, 108) may be disposed between each layer (105, 107, 109) of substrate 102 (e.g., a spiral-wound mesh) such that separator (106, 108) supports and separates layers (105, 107, 109) of substrate 102. As such, separator (106, 108) may be spiral-wound, may be formed from individual, concentric cylindrical layers, or may be formed in any other shapes/sizes as necessary to support and/or separate the individual layers of the substrate 102. The separator (106, 108) may be formed from any of the materials from which the substrate 102 may be formed. In various embodiments, the separator (106, 108) is formed from the same material as the substrate 102 or from a different material from the substrate 102. In various embodiments, the separator (106, 108) may be formed from PTFE.

Turning now to FIG. 2, there is shown a perspective view of a portion of substrate 102 wound in a spiral about axis A. Though not shown in FIG. 2, substrate 102 may further include separator (106, 108; designated by the dot-dashed line 202) rolled into the spiral with the substrate 102, such that each layer of substrate 102 (105, 107, 109), is separated by the rolled separator 202.

Figure 4A:
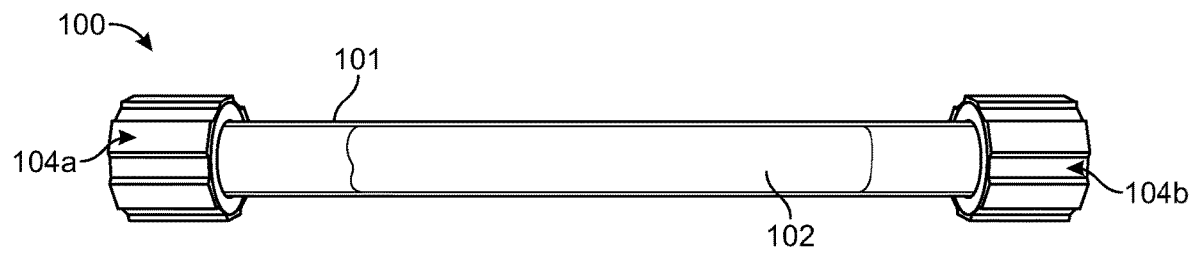
FIGS. 4A and 4B are pictorial diagrams showing an exemplary storage device containing a wick substrate according to various embodiments of the present invention.
Figure 4B:
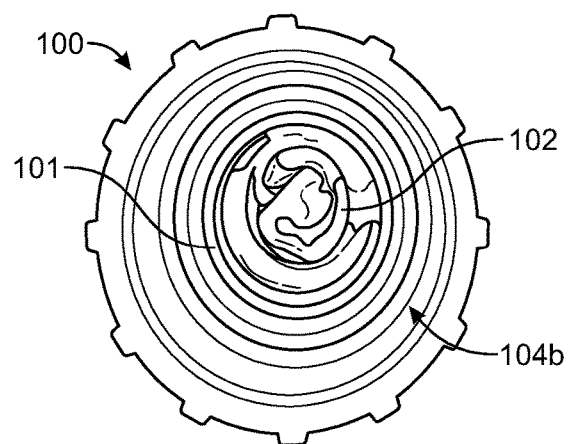
Figure 4C:
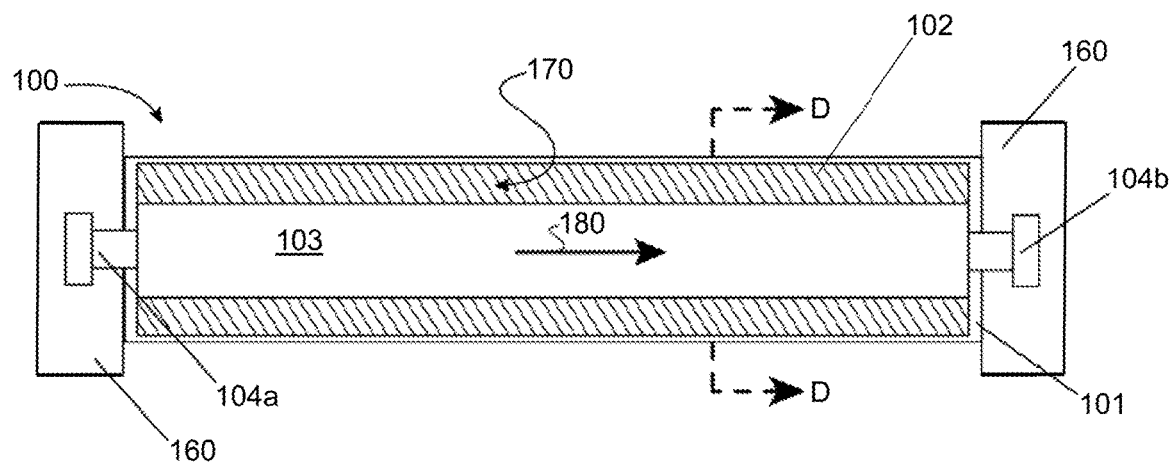
FIG. 4C is a pictorial diagram showing a cross-sectional view of a storage device containing a hydrogel substrate according to various embodiments of the present invention.
Figure 4D:
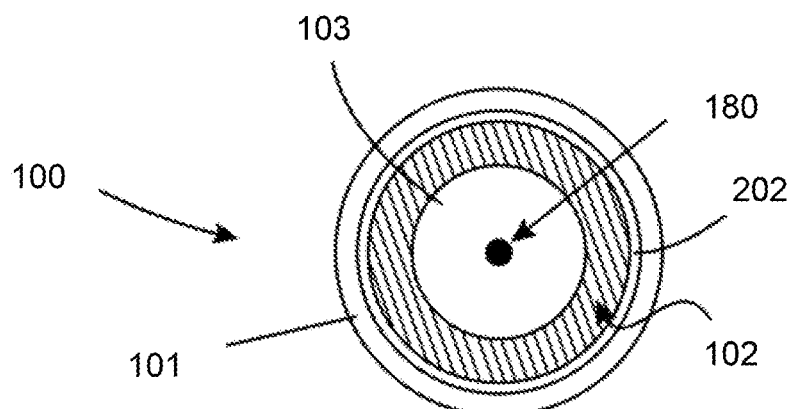
FIG. 4D is a pictorial diagram showing a cross-sectional view of a storage device containing a hydrogel substrate taken along line D-D of FIG. 14C according to various embodiments of the present invention.
Figure 4E:
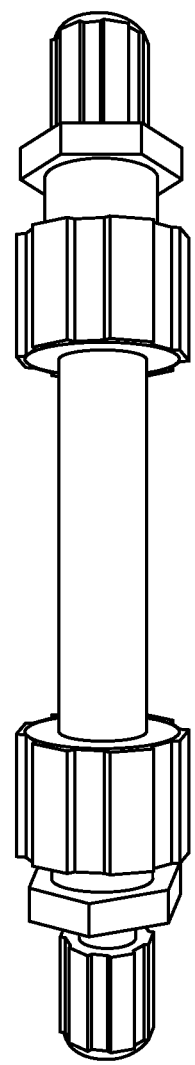
FIG. 4E is a pictorial diagram showing a perspective view of a storage device according to various embodiments of the present invention.

FIGS. 4A-4E show an exemplary embodiment of storage device 100 in accordance with one or more embodiments of the disclosure. FIGS. 4C and 4D illustrate a side cross-sectional view and a top cross-sectional view (taken along line D-D of FIG. 4C), respectively. As shown, substrate 102 (i.e., wick material) was rolled into a spiral form (as shown in FIG. 2) and inserted into housing 101. Housing 101 is therefore configured to allow a carrier gas (e.g., nitrogen) to flow through a head space 103 of the substrate 102 to traverse the housing 101 via input port 104a and output port 104b. As shown in FIGS. 4D and 4E, caps 160 may be used to close off input port 104a and output port 104b. Substrate 302 may contain the adsorbed process solution 170 and the flow of the carrier gas 180 (indicated by directional arrow) may allow for relatively parallel flow of vapor from the process solution through head space 103 and output port 104b to an application process.

In various embodiments, the process solution provided in the storage device may be a liquid or gaseous solution. For example, the process solution may be hydrogen peroxide (e.g., an aqueous hydrogen peroxide solution or an anhydrous hydrogen peroxide solution), hydrazine (e.g., an aqueous hydrazine solution, an anhydrous hydrazine, or any anhydrous derivative of hydrazine, such as, for example, mono-methyl hydrazine, tertiary butyl hydrazine, methylhydrazine, dimethylhydrazine, etc.), and any derivative thereof.

Thus, the substrate may be used for storing, e.g., anhydrous hydrazine and dispensing hydrazine vapor to a critical process, application or storage vessel. As described above, liquid or gaseous anhydrous hydrazine may be absorbed into the porous materials by physical absorption. The quantity and/or concentration of the anhydrous hydrazine loaded into the storage device can therefore be controlled by varying the contact time with the substrate or by varying the type and porosity of the materials used to form the substrate. In various embodiments, the storage device is configured to store about 30 to 1900 weight percent, for example about 30 to 800 weight percent of the process solution/substrate complex, or about 30 to 100 weight percent of the process solution/substrate complex. Thus, in various embodiments, the storage device is configured to store about 100 weight percent, about 200 weight percent, about 300 weight percent, about 400 weight percent, about 500 weight percent, about 600 weight percent, about 700 weight percent, about 800 weight percent, about 900 weight percent, about 1000 weight percent, about 1100 weight percent, about 1200 weight percent, about 1300 weight percent, about 1400 weight percent, about 1500 weight percent, about 1600 weight percent, about 1700 weight percent, about 1800 weight percent, or about 1900 weight percent of the process solution/substrate complex. When the storage device is in use for delivering a process gas (e.g., hydrazine vapor), the gas is delivered by producing a low pressure (i.e., vacuum) downstream of the storage device or by flowing an inert carrier gas through the storage device. In various embodiments, output of the hydrazine vapor can be controlled by varying one or more of the pressure or the flow rate of the inert carrier gas.

The following examples are intended to illustrate, but not limit, the invention.

Example 1

PTFE Wick for Anhydrous Hydrogen Peroxide

The purpose of this example is to determine the compatibility and absorbency of hydrophilic PTFE with anhydrous hydrogen peroxide. Hydrophilic PTFE PWP-100-100 samples do not react with 30 wt %, 45 wt % and anhydrous peroxide. The material has been shown to absorb hydrogen peroxide at least four times its own mass. Test results are summarized in Table 1.

TABLE 1

Sample Comparison of 30, 70, & >90 wt. % Peroxide Absorption and Retention by Hydrophilic PTFE Materials over 24 hours.

| Sample | Material | wt % $H_2O_2$ | Dry material weight (g) | $H_2O_2$ absorbed (g) | % wt uptake | wt. loss (g) | % wt. Retention | Reaction | Shape |
|---|---|---|---|---|---|---|---|---|---|
| 1 | PTFE | 30 | 0.124 | 0.515 | 415 | 0 | 100 | NR | Rod |
| 2 | PTFE | 45 | 0.126 | 0.693 | 550 | 0.03 | 95.7 | NR | Rod |
| 3 | PTFE | anhydrous | 0.157 | 0.757 | 482 | 0 | 100 | NR | Rod |

Thereafter, the output of anhydrous hydrogen peroxide vapor was tested for hydrophilic PTFE samples, PTFE WPW-100-100 and PTFE WPW-0450-80, respectively, over time at 35° C./500 sccm nitrogen, where the average output was calculated between 20 and 100 minutes. The parameters for this experiment are shown in Table 2. The PTFE sheets were folded into 4-layered strips and rolled into cylinders with hydrophobic PTFE mesh.

TABLE 2

Test Parameters for PTFE Material

| Sample # | Polymer | Basic Weight (g/m2) | Basic Weight (g/in$^2$) | Wick Mass Required (g) | Wick Size Required (In$^2$) | Process Temp (° C.) | Carrier Gas Flow (sccm) | Pressure (torr) |
|---|---|---|---|---|---|---|---|---|
| WPW-100-100 | Hydrophilic PTFE | 30 | 0.019 | 2.33 | 122.63 | 35 | 500 | 760 |
| WPW-045-80 | Hydrophilic PTFE | 34 | 0.022 | 2.33 | 105.91 | 35 | 500 | 760 |

While the WPW-0450-80 sample had a higher maximum vapor output than the WPW-100-100 sample, its output decreased after reaching this peak and never stabilized. Table 3 provides a summary of the anhydrous hydrogen peroxide vapor output for the PTFE samples tested.

TABLE 3

Anhydrous Peroxide Vapor Output Summary for PTFE Material

| Sample | Run Time (min.) | Ave Flow Rate for Total Run Time (mg/min) | Ave Oven Temperature (° C.) | Avg $H_2O_2$ Flow Rate by 465 L (mg/min) | Maximum $H_2O_2$ Conc by 465 L (PPM) | Avg $H_2O_2$ Conc by 465 L (PPM) |
|---|---|---|---|---|---|---|
| WPW-100-100 | 961 | 1.05 | 35 | 1.49 | 2026 | 1957 |
| WPW-045-80 | 1267 | 0.80 | 35 | Not Stable | 2326 | Not Stable |

Example 2

Micro-Porosity, Non-Woven Fabric for Anhydrous Peroxide Vapor Output

This example provides test information for use of a micro-porous, synthetic, non-woven, wicking fabric as the substrate of the storage device for use with anhydrous hydrogen peroxide, along with a determination of whether the cartridge had comparable output concentration to the BRUTE® peroxide vaporizer (BPV), solvent-based, BRUTE® Peroxide 120E (BP) under similar temperature and carrier gas flow conditions. The wick vaporizer (storage device) was initially validated with 50% w/w hydrogen peroxide before testing with anhydrous HP due to safety concerns.

The test storage device (anhydrous hydrogen peroxide vaporizer (APV) cartridge) used a spiral-wound, hollow-core, hydrophilic, non-woven polymer, wick reservoir element (substrate) with an integral mesh PTFE layer separator. The experiment also tested incorporation of an internal orifice to increase upstream gas retention time in the wick's core, and a wick material that functions as a solid, diluting mass for a specific quantity of anhydrous hydrogen peroxide.

The hydrogen peroxide (HP) vapor output test was performed with various wick materials and the spiral-wound wick core was sized to fit inside a 250 mL BPV. The Brute Peroxide Test/Fill Station was used to determine vapor pressure from the $H_2O_2$ loaded on the substrate/wick. The constructed APV test cartridge was used to check output concentration response of the test, at various conditions, using a 30% w/w hydrogen peroxide liquid loading of anhydrous hydrogen peroxide solution onto the substrate/wick material. Equation (1.1) was used for the loading requirement:

$$AP(g)/(Wick(g)+AP(g)) \times 100\% = 30\% \text{ w/w of anhydrous hydrogen peroxide} \quad (1.1)$$

This test used a pre-determined 1 gram quantity of anhydrous hydrogen peroxide using various Polyethylene/Polyethylene terephthalate (PE/PET) materials. In order for a wick/substrate material to be eligible for this test, it must have a minimum adsorbancy of 42.9% to ensure that the wick material will adsorb enough liquid to make a 30% w/w $H_2O_2$ system. Here, the liquid added is 1 g of anhydrous $H_2O_2$ (assumed to be 100% w/w $H_2O_2$). In order to create a 30% w/w $H_2O_2$ system, the wick must weigh 2.33 g, which was calculated as follows:

% Adsorbancy,min=100%*(Liquid adsorbed mass/fabric mass)=100%*(1 g/(2.33 g))=42.9%

In addition, the wick must be able to retain the loaded liquid without dripping. Assuming that retention scales linearly with liquid adsorbed, the following relation determines the minimum retention:

% Retention,min=100%*(Liquid added/Liquid capacity)

Liquid capacity=% Adsorbancy,measured*fabric mass/100%

Assuming % Absorbancy,measured is 250% (for example) and using 2.33 g of wick material Liquid capacity=250%*1.33 g/100%=3.33 g % Rentention,min=100%*(1 g/3.33 g)=30%, where 1 g of liquid loading is from anhyrous peroxide Seven non-woven polymers were selected and considered suitable for the experiment based on prior absorbance and retention tests, which are summarized in the abbreviated Table 4. Such results were based on two square inch samples of sheet, non-woven wicking fabric.

TABLE 4

30, 70% w/w HP and anhydrous HP Absorption and Retention by Non-Woven Material over 24 Hours. Data was omitted where absorption was not quantified and for materials that were not used for the wick output testing.

| Sample # | Polymer | $H_2O_2$ Concentration Tested (% w/w) | Dry Fabric Mass (g) | Liquid Absorbed (g) | % Absorbed | Liquid Loss Over 24 Hours (g) | % Retained | Reaction | Shape | Description |
|---|---|---|---|---|---|---|---|---|---|---|
| 5 | PE/PET | 30 | 0.03 | 0.44 | 1467 | 0.09 | 79.5 | NR | Sheet | Card/Calendared |
| 8 | PP/40 | 30 | 0.06 | 0.07 | 117 | 0.03 | 57.1 | NR | Sheet | Spunbound |
| 9 | PP/70 | 30 | 0.10 | 0.80 | 800 | 0.1 | 87.5 | NR | Sheet | Meltblown |

TABLE 4-continued 30, 70% w/w HP and anhydrous HP Absorption and Retention by Non-Woven Material over 24 Hours. Data was omitted where absorption was not quantified and for materials that were not used for the wick output testing.

| Sample # | Polymer | $H_2O_2$ Concentration Tested (% w/w) | Dry Fabric Mass (g) | Liquid Absorbed (g) | % Absorbed | Liquid Loss Over 24 Hours (g) | % Retained | Reaction | Shape | Description |
|---|---|---|---|---|---|---|---|---|---|---|
| 11a | PET/RAY | 30 | 0.07 | 0.96 | 1371 | 0.17 | 82.3 | NR | Sheet | Hydroentangled |
| 5 | PE/PET | 70 | 0.05 | 0.55 | 1100 | 0.04 | 92.7 | NR | Sheet | Card/Calendared |
| 8 | PP/40 | 70 | 0.05 | 0.61 | 1220 | 0.11 | 82.0 | NR | Sheet | Spunbound |
| 9 | PP/70 | 70 | 0.08 | 0.87 | 1088 | 0.10 | 88.5 | NR | Sheet | Meltblown |
| 11a | PET/RAY | 70 | 0.07 | 0.99 | 1414 | 0.00 | 100.0 | NR | Sheet | Hydroentangled |
| 2 | PE/PET | 99 | 1.15 | 1.15 | 1917 | 0.09 | 92.2 | NR | Sheet | Card/Thru Air |
| 5 | PE/PET | 99 | 0.49 | 0.49 | 817 | 0.06 | 97.8 | NR | Sheet | Card/Calendared |
| 8 | PP/40 | 99 | 0.05 | 0.44 | 880 | 0.02 | 95.5 | NR | Sheet | Spunbound |
| 9 | PP/70 | 99 | 0.09 | 0.82 | 911 | 0.12 | 85.4 | NR | Sheet | Meltblown |
| 11a | PET/RAY | 99 | 0.06 | 0.83 | 1383 | 0.00 | 100.0 | NR | Sheet | Hydroentangled |
| 12 | Lyocel/PET | 99 | 0.13 | 0.34 | 262 | 0.03 | 91.2 | NR | Sheet | Spunlace |
| 11b | PP | 99 | 0.10 | 0.49 | 490 | 0 | 100.0 | NR | Sheet | Needle |

It was determined that depending on the total mass of the wicking fabric, the net weight of HP mass can be dramatically affected. The heavier the wick, the more HP mass can be accommodated per cartridge volume and still maintain the 30% w/w. The separator/support material weight was not included in calculating the 30% w/w for the below described experiment, only the substrate/wick and the solution weights. The benefit of the wicking fabric is to safely constrain a practical amount of anhydrous HP in a solid structure during handling. The wick eliminates the separation problem that can occur in liquid solvents and, depending on the exact definition of concentration, provides higher deliverable volumes of concentrated hydrogen peroxide vapor.

Figure 5:
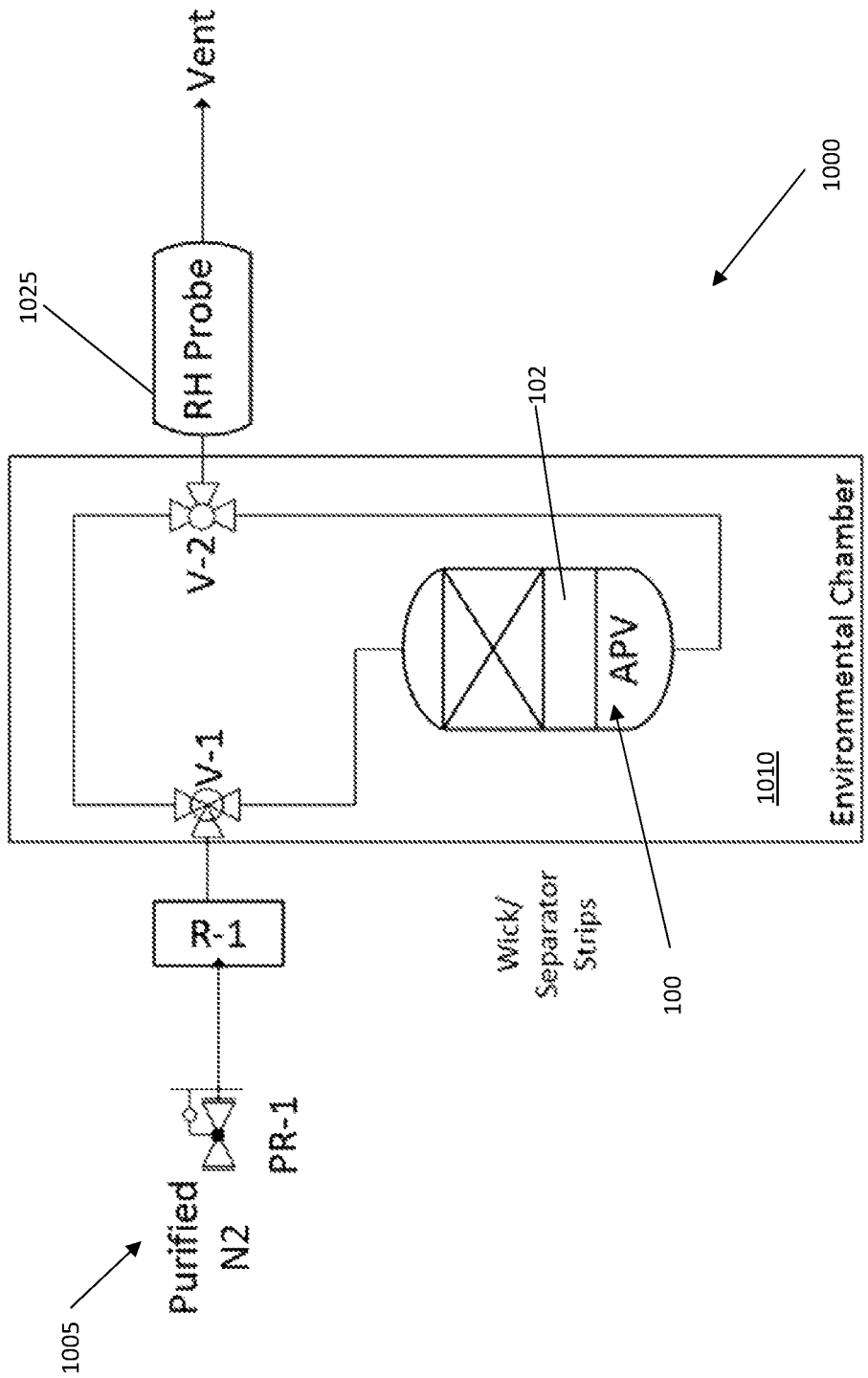
FIG. 5 is a pictorial diagram of a P&ID used for testing according to various embodiments of the present disclosure.

As shown in FIG. 5, a manifold 1000 was constructed for the pre-dry down of the wick material before filling with anhydrous hydrogen peroxide for the flow test experiment. Purified nitrogen 1005 was supplied to a 500 sccm air rotameter (i.e. R-1) at 25 psig using a forward pressure regulator (i.e. PR-1). R-1 was set to 500 sccm to flow to an assembled APV (storage device 100), which includes a substrate 1020 (i.e. a wick material with separator). The APV was place in a B-M-A environmental chamber 1010 and the chamber 1010 was set to 45° C. The outlet of APV was sent to a relative humidity (RH) probe to quantify the moisture content in the wick material. APV remained in the heated environmental chamber 1010 with 500 sccm of nitrogen flow until the moisture at an RH probe 1025 was below 5% RH. After the wick was sufficiently dried, two PTFE three-way valves (i.e. V-1 and V-2) were used to isolate APV for transport to a glove box for filling with anhydrous hydrogen peroxide.

As shown in FIG. 6, a manifold 1100 was utilized for the vapor flow test/experiment in this Example. Purified nitrogen 1105 was supplied to MFC-1 and MFC-2 at 25 psig using a forward pressure regulator (PR-1). A 5 SLM Brooks MFC (MFC-1) (Brooks SLA5850 S-Series Mass Flow Controller) controlled the flow rate of carrier gas 1105 to (storage device 100), which includes a substrate 102 and separator strips (106, 108; FIGS. 1 and 2) and a 7/64" diameter orifice reducer (not shown). A 1/3 PSI check valve (CV-1) was installed downstream of the MFC to prevent chemical exposure. A 0-30 PSIG pressure transducer (PT-1) was used to monitor the pressure upstream of test vaporizer 1015. The APV cartridge was filled with 1 gram of anhydrous HP to add $H_2O_2$ vapor to the carrier gas. Using Equation (1.1), the total mass of the wick sample was 2.33 g. The APV was placed inside the environmental chamber 1110 (B-M-A Inc. Environmental Chamber (Model TC-4)) and its temperature was kept constant during each test. The dilution and carrier gas temperatures were controlled to the same temperature as environmental chamber 1110 using TC-1 and TC-3. PTFE valves (V-1 and V-2) were used to direct gas flow directly to analyzer 1120 (zero gas) or through APV 1015. A PSI check valve (CV-2) was installed downstream of MFC-2 prevented chemical exposure. The analyzer 1120 was used to measure the $H_2O_2$ vapor output during the test. A PLC (Programmable Logic Controller) was used to record the Ozone analyzer reading and pressure reading from PT-1. The $H_2O_2$ scrubbers decompose $H_2O_2$ from the process gas into $O_2$ and $H_2O$. The gas lines between the APV outlet and scrubber were heat traced and kept heated on the skin such that the inline outlet gas temperature (TC-2) stayed above the environmental chamber temperature. The setup, excluding environmental chamber 1110, was placed inside a fume hood.

The environmental chamber temperature and inlet gas temperature were set to a temperature listed in Table 5. Initially, the valves were positioned to allow the gas to flow to the analyzer. For this experiment, the carrier gas flow rate was 500 sccm, which corresponds to the max flow of the BPV. The APV output was diluted with 500 sccm of $N_2$. The dilution gas line temperature was set to a temperature listed in Table 5. Once the temperatures were stabilized under these conditions, analyzer 1120 was zeroed. Once a stable zero reading was obtained, data collection from analyzer 1120 began. The vessel of APV 1015 was placed in environmental chamber 1110 for 30 minutes before the test commenced to allow the vessel to come to temperature. After 30 minutes, the valves were positioned to allow the gas the flow through APV 1015 and to analyzer 1120. After output reached a maximum and began to fall, the valves were positioned to allow the gas to flow directly to analyzer 1120 and to isolate APV 1015. This data was used to determine a zero drift. After 15 minutes, data collection was discontinued. The temperature controllers were shut down and the lines and analyzer 1120 were allowed to return to room temperature before the gas flow was discontinued.

TABLE 5

Test parameters

| Test | Sample # | Polymer | Process | Basis Weight (g/m2) | Bsis Weight (g/in2) | Wick Mass Required (g) | Wick Size Required (in2) | Process Temp (° C.) |
|---|---|---|---|---|---|---|---|---|
| 1 | 5 | PE/PET | Card/Calendared | 40 | 0.026 | 2.33 | 90.42 | 35 |
| 2 | 9 | PP/70 | Melt Blown | 70 | 0.045 | 2.33 | 51.67 | 35 |
| 3 | 11a | PET/RAY | Hydroentangled | 55 | 0.035 | 2.33 | 65.76 | 35 |
| 4 | 12 | Lyocel/PET | Spunlace | 100 | 0.065 | 2.33 | 36.17 | 35 |
| 5 | 2 | PE/PET | Card/Thru Air | 40 | 0.026 | 2.33 | 90.42 | 35 |
| 6 | 11b | PP | Needle | 71 | 0.046 | 2.33 | 50.94 | 35 |
| 7 | 8 | PP/40 | Spunbound | 40 | 0.026 | 2.33 | 90.42 | 35 |

The structure of the test wicks in the APV cartridge of Example 3 did incorporate the hollow-core design shown in FIG. 2, where the APV included a spiral-wound and had a hollow core substrate. More specifically, the APV was a spiral-wound, hollow-core, 4-layer, non-woven, hydrophilic wick element without mesh separators. The non-woven wick material and Teflon separator were rolled into a hollow cylindrical packing and fitted loosely into the APV cartridge tube, as shown in FIGS. 4A-4E.

Table 6 summarizes the results obtained. Using Antoine's equation, the theoretical vapor concentrations from a 100 wt % hydrogen peroxide solution at 35° C. is 5063 ppm for hydrogen peroxide. As with the 50PV tests, the procedure was deviated from to extend the runs to near zero ppm output rather than stopping 30 minutes after reaching peak value. This run extension required the system to be operated over 2 days in 5 of the 7 tests. Each graph shown in FIGS. 7-18 is a result for the run output on that day, starting from zero minutes, whether it was a single run or a continuation. However, due to the larger, bulky size of the APV cartridges with their isolation valve block, it was not possible to measure the minute interim mass losses. As a result, Table 6 shows some missing average flow rate data, marked as "nt" for not taken.

The common observation of all the individual runs was that there was a faster rise to peak hydrogen peroxide vapor concentration in comparison to the 50% solution. However, AP peak concentration values did not rise appreciably.

The top three non-woven wicks for peak anhydrous peroxide concentration were: Sample 11 (3243 ppm), Sample 8 (3171 ppm), and Sample 5 (2978 ppm). Compared to the 50PV tests, the second day APV peak output run values were much closer (6 to 12%) to the first day run. Sample 12 was the exception: the 2nd day run peak value was 35% higher than the first day. Coincidently, the rayon based Sample 12 took twice the amount of time to dry.

With respect to longevity of output, the top three materials were: Sample 5 (2750 ppm), Sample 11 (2213 ppm), and Sample 9 (2134 ppm) on average. There was no color change or any measurable exotherm, indicating rapid oxidation.

Figure 19:
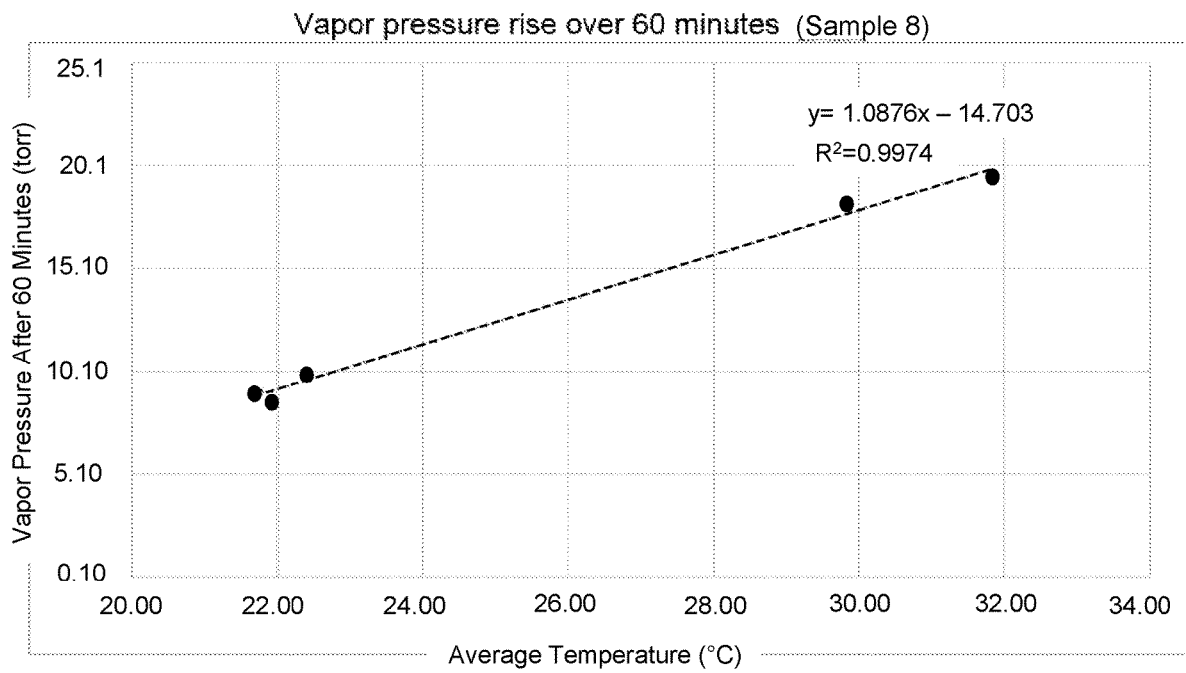
FIG. 19 is a graphical diagram showing vapor pressure rise over temperature during the vapor pressure tests according to certain embodiments of the present disclosure.

Table 7 shows the summary of results of the vapor pressure rise tests. Sample 9 was not tested due to anhydrous $H_2O_2$ leaking out of the wick roll during filling. Sample 12 was not tested due to scarring of the fabric during anhydrous $H_2O_2$ flow testing. Sample 5 had the largest average pressure rise over 60 minutes. However, those pressure rise tests were done at a higher average temperature than all other pressure rise tests. As shown in FIG. 19, Sample 8 showed a strong correlation between average temperature and vapor pressure after 60 minutes. This trend is consistent and supported by Raoult's law. However, Raoult's law predicts a vapor pressure of 5.3 torr from a 90% w/w $H_2O_2$ in water solution at 31.83° C. After 60 minutes, every material filled with anhydrous peroxide had a vapor pressure above this value. Additionally, the vapor pressure was still increasing at 60 minutes for every material tested.

TABLE 6

Anhydrous Peroxide Vapor Output Summary

| Test | Run Time (min) | Avg Flow Rate for Total Run Time (mg/min) | Avg Oven Temperature (° C.) | Avg H2O2 Flow Rate by 465 L (mg/min) | Maximum H2O2 Conc by 465 L (PPM) | Avg H2O2 Conc by 465 L (PPM) | Run Sequence |
|---|---|---|---|---|---|---|---|
| 1a | 222 | nt | 36 | 2.11 | 2978 | 2770 | 1 of 2 |
| 1b | 339 | 2.35 | 35 | 1.21 | 2835 | 1590 | 2 of 2 |
| 2a | 223 | nt | 35 | 1.78 | 2602 | 2346 | 1 of 2 |
| 2b | 1520 | 0.63 | 35 | 1.40 | 2773 | 1846 | 2 of 2 |
| 3a | 495 | nt | 35 | 0.92 | 1993 | 1213 | 1 of 2 |
| 3b | 453 | 1.03 | 37 | 0.90 | 1305 | 1184 | 2 of 2 |
| 4a | 228 | nt | 35 | 0.84 | 1218 | 111 | 1 of 2 |
| 4b | 5689 | 0.12 | 35 | 0.70 | 1856 | 920 | 2 of 2 |
| 5a | 391 | nt | 35 | 1.15 | 1829 | 1507 | 1 of 2 |
| 5b | 441 | 1.15 | 36 | 1.09 | 2085 | 1434 | 2 of 2 |
| 6 | 380 | 1.1 | 35 | 1.91 | 3243 | 2513 | 1 of 1 |
| 7 | 373 | 2.14 | 35 | 2.05 | 3171 | 2698 | 1 of 1 |

TABLE 7

Vapor Pressure Rise Test Result Summary

| Test | Sample # | Polymer | Process | Average Temperature (° C.) | Avg Pressure After 60 min (torr) | Avg Pressure Rise in 60 min (torr/min) | Pressure Stability for 10 minutes? (Notes) |
|---|---|---|---|---|---|---|---|
| 1 | 5 | PE/PET | Card/Calendared | 31.83 | 19.57 | 0.30 | x |
| 2 | 9 | PP/70 | Melt Blown | — | — | — | (Fill failed) |
| 3 | 11a | PET/RAY | Hydroentangled | 22.4 | 9.91 | 0.13 | x |
| 4 | 12 | Lyocel/PET | Spunlace | — | — | — | (Scarred during flow test) |
| 5 | 2 | PE/PET | Card/Thru Air | 29.85 | 18.18 | 0.28 | x |
| 6 | 11b | PP | Needle | 21.73 | 9.07 | 0.12 | x |
| 7 | 8 | PP/40 | Spunbound | 21.93 | 8.67 | 0.12 | x |

All the non-woven samples transmitted hydrogen peroxide vapor. A generally inverse relationship of liquid peroxide percent absorbency to peak peroxide vapor dispersion concentration emerged with the APV flow tests. With the exception of Sample 12, Table 8 shows consistently that the non-woven fabrics in this test group, with the lowest percent absorbency of AP had, correspondingly, the greatest peak vapor dispersion concentration measured in ppm.

The average vapor output concentration in ppm also follows a similar inverse relationship to percent absorbency, again with the exception of Sample 12. Polar, hydrophilic, rayon-based fabrics, Sample 11 and Sample 12 provide the lowest peak vapor concentration values and were physically deteriorated in the presence of APV.

TABLE 8

A Comparison of Maximum and Average Vapor [C] to percent Absorbency

| Sample # | Polymer | [C] Wt. % H2O2 | Dry Fabric Wt. (g) | Liquid added (g) | % Absorbed | Maximum H2O2 Conc by 465 L (PPM) | Avg H2O2 Conc by 465 L (PPM) | Bonding Process Description |
|---|---|---|---|---|---|---|---|---|
| 2 | PE/PET | 99 | 0.06 | 1.15 | 1917 | 2085 | 1507 | Card/Thru Air |
| 11a | PET/RAY | 99 | 0.06 | 0.83 | 1383 | 1993 | 1213 | Hydroentangled |
| 9 | PP/70 | 99 | 0.09 | 0.82 | 911 | 2773 | 2346 | Meltblown |
| 8 | PP/40 | 99 | 0.05 | 0.44 | 880 | 3171 | 2698 | Spunbound |
| 5 | PE/PET | 99 | 0.06 | 0.49 | 817 | 2978 | 2770 | Card/Calendared |
| 11b | PP/71 | 99 | 0.10 | 0.49 | 490 | 3243 | 2513 | Needle |
| 12 | Lyocel/PET | 99 | 0.13 | 0.34 | 262 | 1856 | 920 | Spunlace |

Hydrophobic polymers PP or PE/PET produced the greatest peak and longevity concentration values apparently due to the non-polar, adsorbent polymer structure. To increase hydrophilicity, PP and PET may be physically altered, increasing fiber cross-sectional area, decrease fiber diameter or increase fiber orientation in the direction of transport. Molecularly hydrophobic PP and PET fabrics can be mechanically finished in a variety of textile processes to become an adsorbent.

Physical methods to increase surface area per square inch of adsorbent polymers does not increase the polarity of the molecule. Increased surface area allows for weak physical adsorption by Van der Waal interaction (VdW) between liquid peroxide and the solid polymer. The exact nature of VdW interactions between AP and non-polar, hydrophobic long chain polymers is beyond the scope of this report. The measurable differences of AP vapor dispersion in a specific test environment may be attributed to the presence of polar and non-polar adsorbent fabric polymers serving as a liquid storage matrix.

With regard to the different surface finishing processes of the non-woven materials, the needle-punched fabric of Sample 11 appeared to offer an advantage of higher 3D surface area per square inch than carded, melt-blown or calendared pressed. Sample 2 and Sample 5 demonstrated the highest measured vapor pressure due to the correlation between temperature and vapor pressure at 60 minutes.

Example 3

Micro-Porosity, Non-Woven Fabric for 50 wt. % Hydrogen Peroxide Vapor Output The purpose of this example is to present information regarding a micro-porous, synthetic, non-woven, wicking fabric, 50 wt % hydrogen peroxide vaporizer, 50PV cartridge and determine whether the cartridge has comparable vapor output concentration to the Brute® peroxide vaporizer (BPV), solvent-based, 3 wt % water content, BRUTE® Peroxide solution (BP) under similar temperature and carrier gas flow conditions.

This experiment was run using similar methods and test samples to those used in Example 2. For this experiment, for a wick material to be eligible for this test it must have a minimum absorbancy of 150% to ensure that the wick material will absorb enough liquid to make a 30 wt % $H_2O_2$ system. Here the liquid added is 2 g of 50 wt % $H_2O_2$. In order to create a 30 wt % $H_2O_2$ system, the wick must weigh 1.33 g:

% Absorbancy,min=100%*(Liquid absorbed mass/ fabric mass)=100%*(2 g/(1.33 g))=150%

The environmental chamber temperature and inlet gas temperature were set to a temperature listed in Table 14. After the peroxide vapor output test had been performed with each wick material, the spiral-wound wick core was sized to fit inside a 250 mL BPV. The BRUTE Peroxide Test apparatus (FIG. 6) was used to determine vapor pressure rise rate from the $H_2O2$/water loaded on the wick. An average measured BP output of 3400 ppm based on a 25 wt % BP concentration at 35° C. with 500 sccm $N_2$ carrier flow may be expected. Equation (1.2) represents the loading requirement:

$$HP(g)/(Wick(g)+HP(g)+Water(g))\times 100\%=30 \text{ wt }\% \text{ of hydrogen peroxide} \quad (1.2)$$

The results of the seven non-woven fabrics used were based on two square inch samples of the respective sheets. Only PET/Rayon and Lyocel/PET non-woven fabrics are molecularly hydrophilic absorbents characterized by the ability to uniformly distribute and retain a liquid volume through its whole, solid interior, potentially changing its physical properties due, in part, to hydrogen bonding. Table 9 summarizes the results obtained. Test Run 7, Sample 8, was not performed since the liquid did not fully hold on to the wick material during loading.

Using Raoult's Law, the theoretical vapor concentrations from the 50 wt % hydrogen peroxide solution at 35° C. were 1100 ppm for hydrogen peroxide and 31000 ppm for water. Therefore, the water concentration was 29 times greater than the hydrogen peroxide vapor under such conditions. Given that the water had a higher vapor pressure under the test conditions, the hydrogen peroxide vapor concentration increased as the hydrogen peroxide solution concentration increased on the wick material due to the evaporation of the water content. This partially explains the shape of the wick vapor output curves in FIG. 20. The initial vapor output from four of the six tests are near this theoretical concentration.

Figure 20:
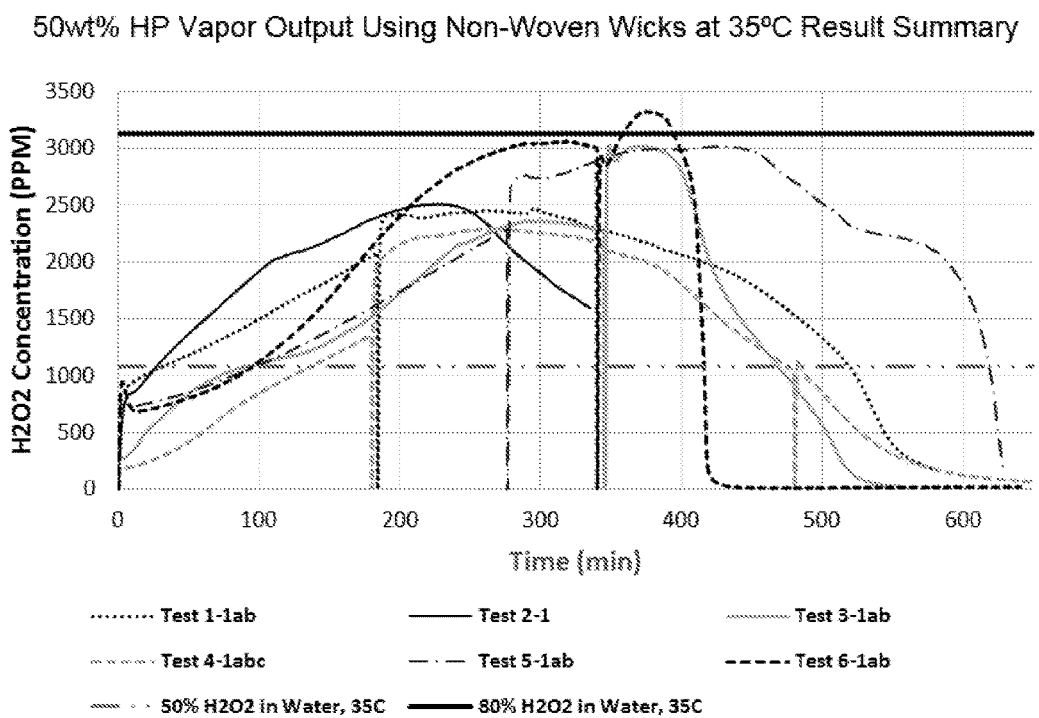
FIG. 20 is a graphical diagram showing the results of vapor output using non-woven wick substrates contained in a storage device according to various embodiments of the present invention.

The theoretical hydrogen peroxide vapor concentration from a 50% hydrogen peroxide solution at 35° C. is represented in FIG. 20. Sample 11a produced the highest peroxide vapor concentration, followed by Sample 11b. Sample 2 produced the longest output curve. Using Raoult's Law, the results from Sample 11b indicate a 3319 ppm hydrogen peroxide vapor output, which is equivalent to an 82 wt % peroxide solution concentration. This vapor output is only slightly below the 3400 ppm seen from the Brute Peroxide 120E solution at 35° C. The theoretical hydrogen peroxide vapor concentration from an 80% hydrogen peroxide solution at 35° C. is represented in FIG. 20.

Table 10 summarizes the additional results from three of the test materials: Sample 5, Sample 12, and Sample 11b, respectively. The other samples could not be tested for this example due to lack of material. Using Raoult's law, the theoretical hydrogen peroxide and water vapor pressures for a 50 wt % hydrogen peroxide solution at room temperature (25° C.) are 0.41 torr and 13.03 torr, respectively. Therefore, the total vapor pressure would be 13.44 torr. All three materials vapor pressures were near this theoretical value after 60 minutes.

At 35° C., the hydrogen peroxide vapor concentrations from some of the wick materials wetted with 50% hydrogen peroxide solution, Sample 11a (3025 ppm), Sample 2 (3020 ppm), and Sample 11b (3319 ppm), were comparable to the Brute Peroxide vapor concentration output (3400 ppm).

The results indicated that hydrogen peroxide vapor output increased as water content decreased inside the wick. Therefore, anhydrous hydrogen peroxide may be used on these wick materials to eliminate the effects of water on hydrogen peroxide output. Since all of the materials did not provide the same vapor output characteristics, this indicates that Raoult's law is not the only factor in determining vapor output for wick materials, as disclosed herein. The total vapor pressure for the three materials that were tested, Sample 5, Sample 12, and Sample 11b, were near the theoretical vapor pressure of 13.4 torr predicted by Raoult's Law.

Example 4

Hydrogel Wick for Anhydrous Hydrogen Peroxide

The purpose of this example is to determine the compatibility and absorbency of a hydrogel to function as a reservoir for anhydrous hydrogen peroxide (HP) storage and shipment. Polyethylene glycol (PEG) hydrogel was synthesized by crosslinking linear PEG diacrylate (Mn:700) into a 3D network with a photo crosslinking method. After contacting the anhydrous HP with the dry synthesized PEG network, a single piece, macro-porous, hydrophilic, polymeric reservoir element was formed. By incorporating the liquid hydrogen peroxide into the 3D polymeric structure of the hydrogel, it was observed that the HP solution was stabilized and the upstream gas retention time increased due to the fixed surface area of the hydrogel structure.

In this experiment, PEG hydrogel samples with a PEG content of 20% and 40% were used to test compatibility and absorbency. The test procedure is described as follows: (1) a piece of dry PEG hydrogel was dipped into anhydrous hydrogen peroxide for 30 seconds; (2) the mass of the hydrogel before and after dipping was recorded; (3) the HP-soaked hydrogel was sealed in a clear plastic vial for 24 hours; (4) throughout the course of the test, the material was inspected for any evidence of reaction or deterioration; and (5) after 24 hours, the hydrogel was weighed again.

No reaction was observed when the dry hydrogel was mixed with anhydrous hydrogen peroxide, and no color or morphological change was found after 24 hours of sitting in a glove box (i.e., environmental chamber). Such results indicate that the hydrogel structure is chemically inert and therefore suitable for use as a substrate in the storage device provided herein. All tested PEG samples absorbed hydrogen peroxide quickly and with a high absorbency capacity. After the hydrogel absorbed the peroxide, the hydrogel swelled, but kept its original shape. The test results are summarized in Table 11.

Thereafter, the anhydrous hydrogen peroxide vapor output from the PEG hydrogel substrate/wick was analyzed. For this experiment, the clear plastic vial was provided with an inlet port and an outlet port, through which nitrogen gas was permitted to flow through the hydrogel cartridge under a specified temperature range. Each Hydrogen Peroxide Vaporizer (HPV) cartridge element constructed was based on a pre-determined quantity of anhydrous HP.

An exemplary test HPV (storage device 100) that includes a PEG hydrogel substrate 102 (e.g., 90PV filled PEG gel) wrapped in a PTFE mesh separator 202 was prepared for this test. It was observed that the PTFE mesh separator 202 maintained the shape of hydrogel substrate 102 and kept the hydrogel substrate from cracking and collapsing when the hydrogen peroxide was released from the storage device 100.

TABLE 14

Test Parameters

| Test | Sample # | Polymer | Process | Hydrophobic or Hydrophilic | Basis Weight (g/m2) | Basis Weight (g/in2) | Wick Mass Required (g) | Wick Size Required (in2) | Process Temp (° C.) |
|---|---|---|---|---|---|---|---|---|---|
| 1 | 5 | PE/PET | Card/Calendared | Hydrophobic | 40 | 0.026 | 1.33 | 51.67 | 35 |
| 2 | 9 | PP/70 | Melt Blown | Hydrophobic | 70 | 0.045 | 1.33 | 29.52 | 35 |
| 3 | 11a | PET/RAY | Hydroentangled | Hydrophilic | 55 | 0.035 | 1.33 | 37.58 | 35 |
| 4 | 12 | Lyocel/PET | Spunlace | Hydrophilic | 100 | 0.065 | 1.33 | 20.67 | 35 |
| 5 | 2 | PE/PET | Card/Thru Air | Hydrophobic | 40 | 0.026 | 1.33 | 51.67 | 35 |
| 6 | 11b | PP | Needle | Hydrophobic | 71 | 0.046 | 1.33 | 29.11 | 35 |
| 7 | 8 | PP/40 | Spunbound | Hydrophobic | 40 | 0.026 | 1.33 | 51.67 | 35 |

TABLE 9

Hydrogen Peroxide Vapor Output Summary

| Test | Time (min) | Avg Total Flow Rate (mg/min) | Avg Oven Temperature (° C.) | Avg $H_2O_2$ Flow Rate, by 465 L Reading (mg/ml) | Maximum $H_2O_2$ Conc, by 465 L (PPM) | Avg $H_2O_2$ Conc, by 465 L (PPM) | Notes |
|---|---|---|---|---|---|---|---|
| 1-1a | 184 | 8.48 | 35 | 1.08 | 2073 | 1478 | |
| 1-1b | 400 | 2.30 | 35 | 1.39 | 2467 | 1834 | Continuation of Previous |
| 2-1 | 335 | 5.22 | 35 | 1.47 | 2507 | 1931 | |
| 3-1a | 345 | 4.70 | 35 | 1.17 | 2360 | 1532 | |
| 3-1b | 212 | 1.75 | 35 | 1.13 | 3025 | 1481 | Continuation of Previous |
| 4-1a | 180 | 9.22 | 35 | 0.56 | 1355 | 743 | |
| 4-1b | 300 | 2.53 | 35 | 1.48 | 2292 | 1952 | Continuation of Previous |
| 4-1c | 360 | 0.11 | 35 | 0.14 | 1147 | 184 | Continuation of Previous |
| 5-1a | 276 | 5.04 | 35 | 1.05 | 2287 | 1378 | |
| 5-1b | 355 | 3.01 | 35 | 1.92 | 3020 | 2524 | Continuation of Previous |
| 6-1a | 340 | 6.26 | 35 | 1.47 | 3058 | 1938 | |
| 6-1b | 300 | 0.80 | 35 | 0.58 | 3319 | 761 | Continuation of Previous |

TABLE 10

Vapor Pressure Rise Test Result Summary

| Test | Sample # | Polymer | Process | Test 1 Pressure Rise in 60 min (torr/min) | Test 2 Pressure Rise in 60 min (torr/min) | Test 3 Pressure Rise in 60 min (torr/min) | Avg Pressure Rise in 60 min (torr/min) | Average Pressure Reading in 60 min |
|---|---|---|---|---|---|---|---|---|
| 1 | 5 | PE/PET | Card/Calendared | 0.12 | 0.15 | 0.14 | 0.14 | 10.29 |
| 4 | 12 | Lyocel/PET | Spunlace | 0.20 | 0.18 | 0.20 | 0.19 | 13.16 |
| 6 | 11b | PP | Needle | 0.24 | 0.20 | 0.17 | 0.20 | 14.18 |

TABLE 11

Sample Comparison of Hydrogen Peroxide Absorption
and Retention by PEG Hydrogel over 24 hours

| Materials | Dry materials weight (g) | $H_2O_2$ absorbed (g) | % wt uptake | wt. loss (g) | % wt. Retention | Reaction |
|---|---|---|---|---|---|---|
| 20% PEG gel | 0.31 | 2.07 | 663 | 0 | 100 | NR |
| 40% PEG gel | 0.39 | 2.34 | 600 | 0.1 | 95.7 | NR |

TABLE 12

Test Parameters

| Test | Sample | Mass of Hydrogel (g) | Mass of 90 HP (g) | Mass of Hydrogel and 90 HP (g) | Process Temp (° C.) |
|---|---|---|---|---|---|
| 1 | 20% PEG pellets | 2.31 | 1.03 | 3.34 | 35 |
| 2 | 40% PEG | 2.27 | 1.03 | 3.30 | 35 |
| 3 | 40% PEG pellets | 2.31 | 1.0 | 3.31 | 35 |

For Test 1, the 20% PEG hydrogel was broken into small pieces. It was loaded into a Teflon bag so that the morphology of the sample was similar to the pellets. For Test 2, the 40% PEG hydrogel was kept in its original shape and loaded as one solid piece into a Teflon bag. For Test 3, the 40% PEG hydrogel was cut into small pellets with a diameter of about 3 mm and then loaded into a Teflon bag. In each test run, the environmental chamber temperature and inlet gas temperature were each set to the temperature listed in Table 12. The carrier gas flow rate was 500 sccm. The output data was recorded until the hydrogen peroxide level was close to zero.

For Tests 1-3, the procedure for the hydrogen peroxide output test was as follows: (1) The PEG hydrogel was wrapped with Teflon mesh to form a cylinder cartridge element to fit the vaporizer; (2) Nitrogen was allowed to flow through the vaporizer at 40° C. until the material was dry; (3) The hydrogel was loaded with anhydrous peroxide. The hydrogel's mass was recorded before and after loading; (4) The vaporizer was installed into the test chamber; (5) The test was run under the parameters in Table 12. The hydrogen peroxide output concentration was recorded until the measurement was close to zero; and (6) The hydrogel was removed from the vaporizer and reweighed.

Figure 8:
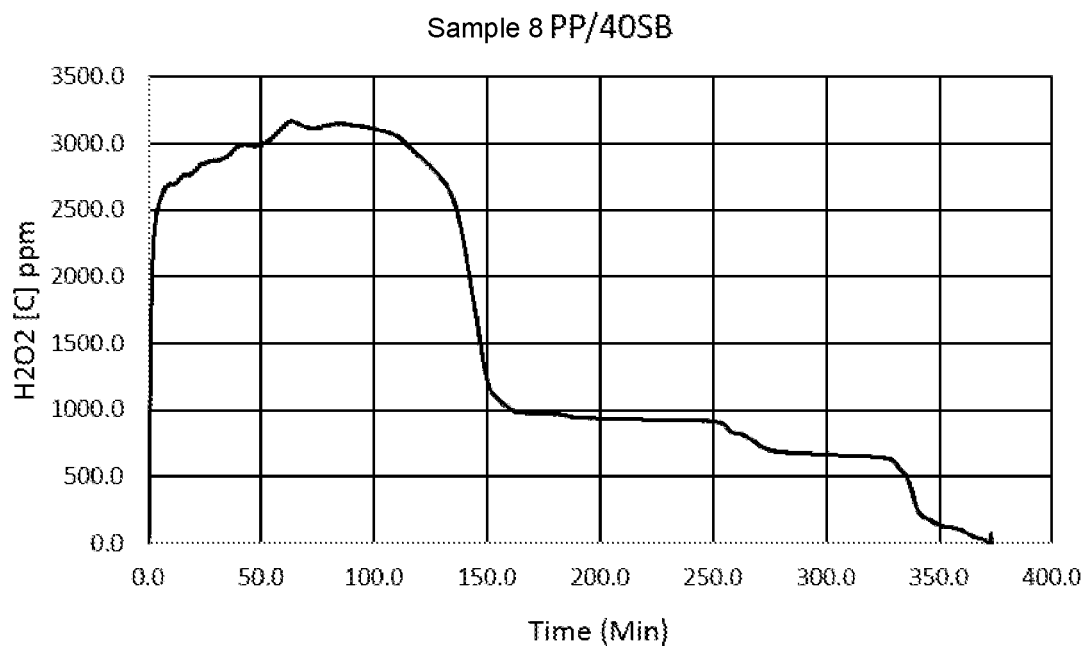
Figure 9:
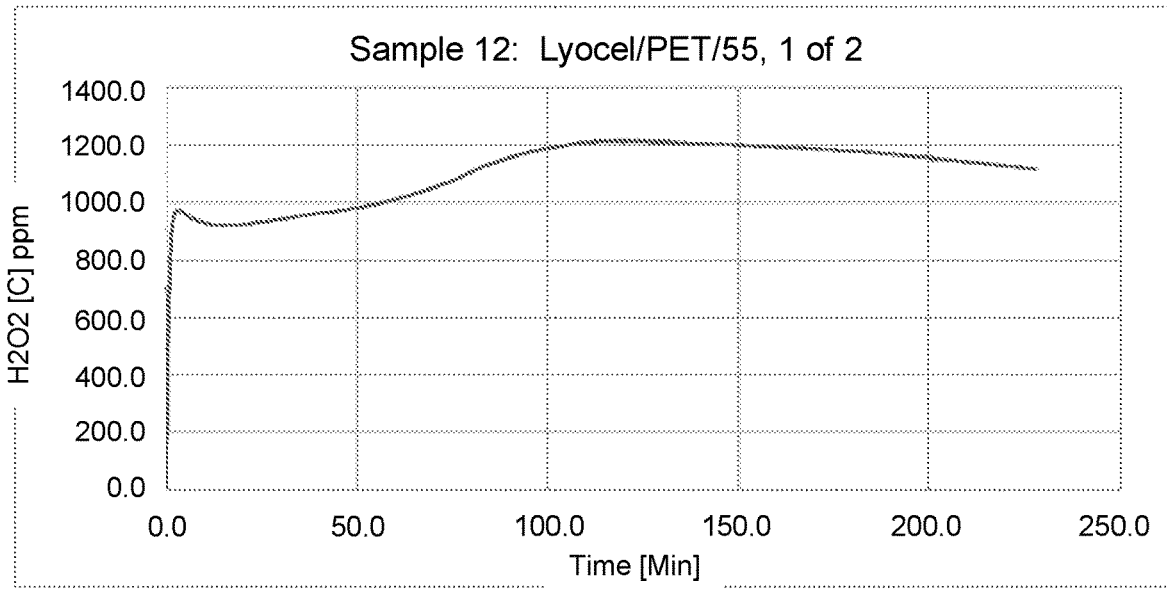
Figure 10:
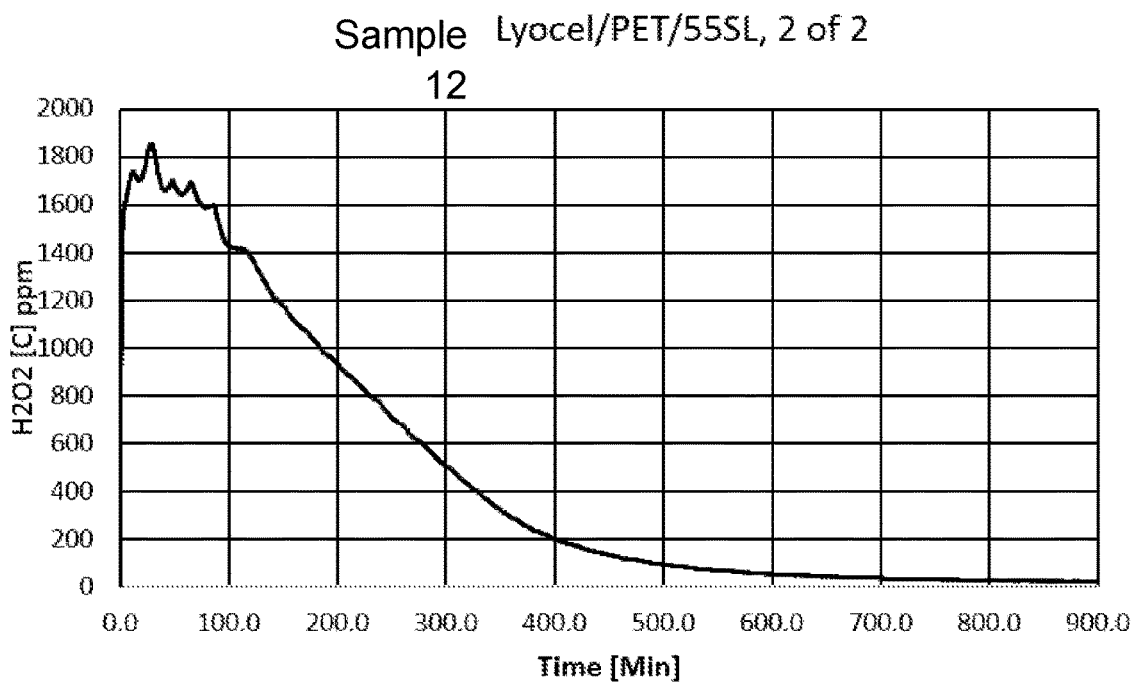
Figure 11:
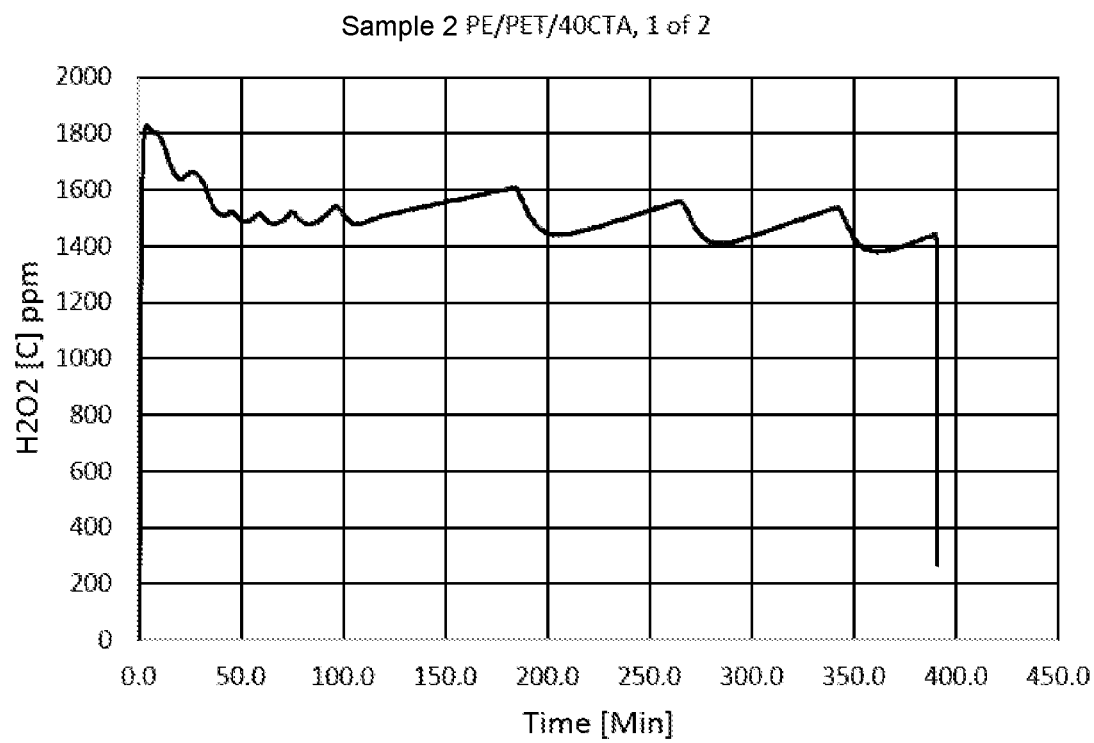
Figure 12:
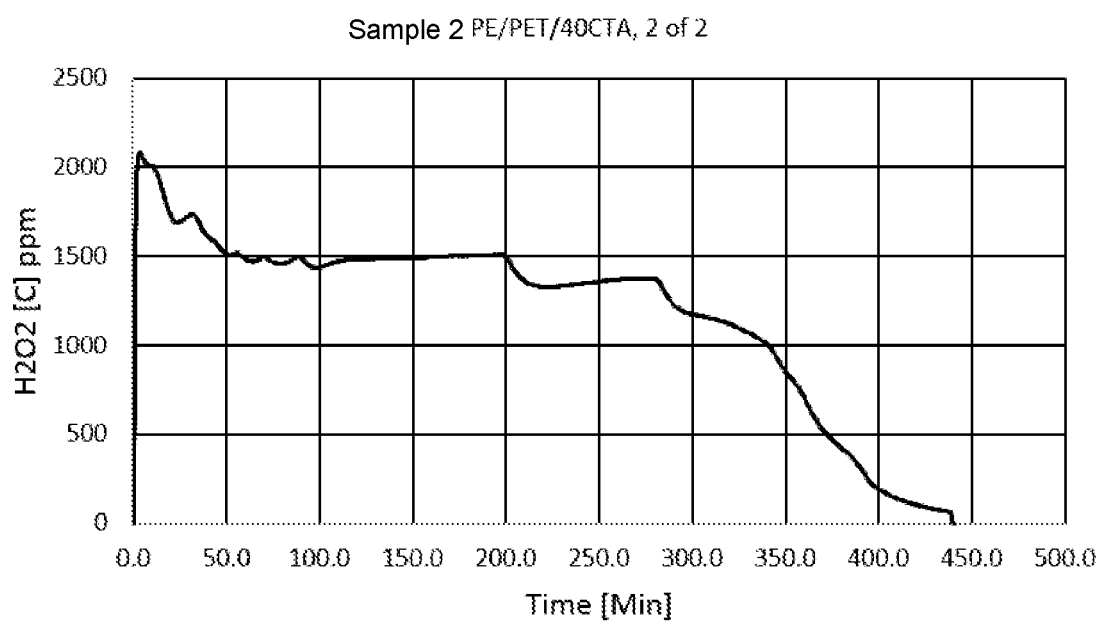
Figure 13:
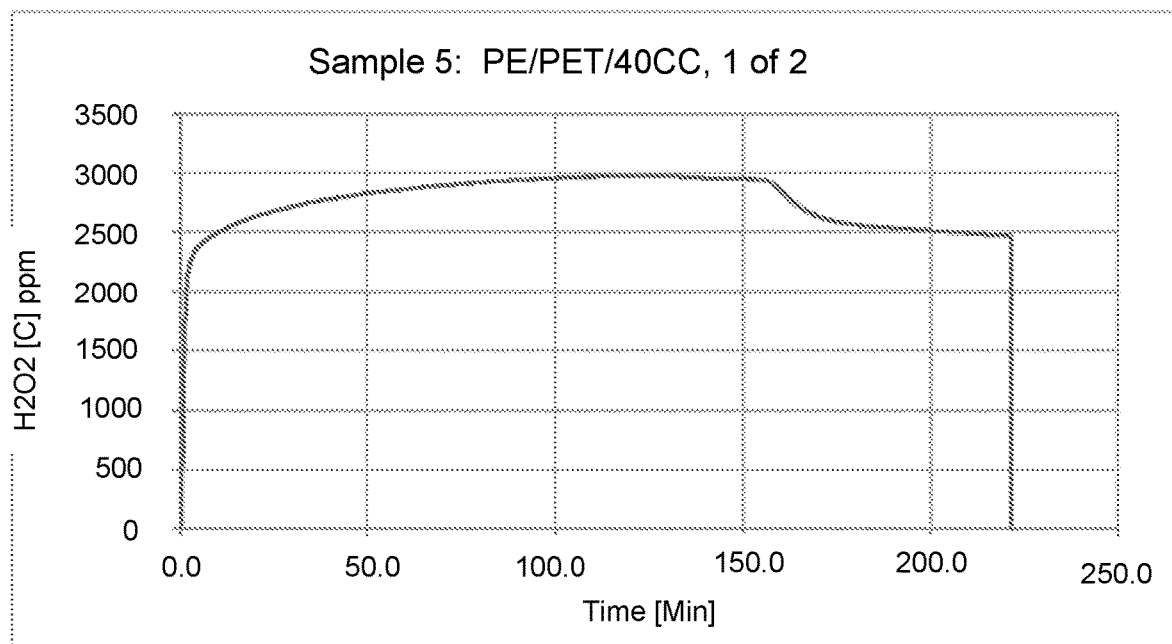
Figure 14:
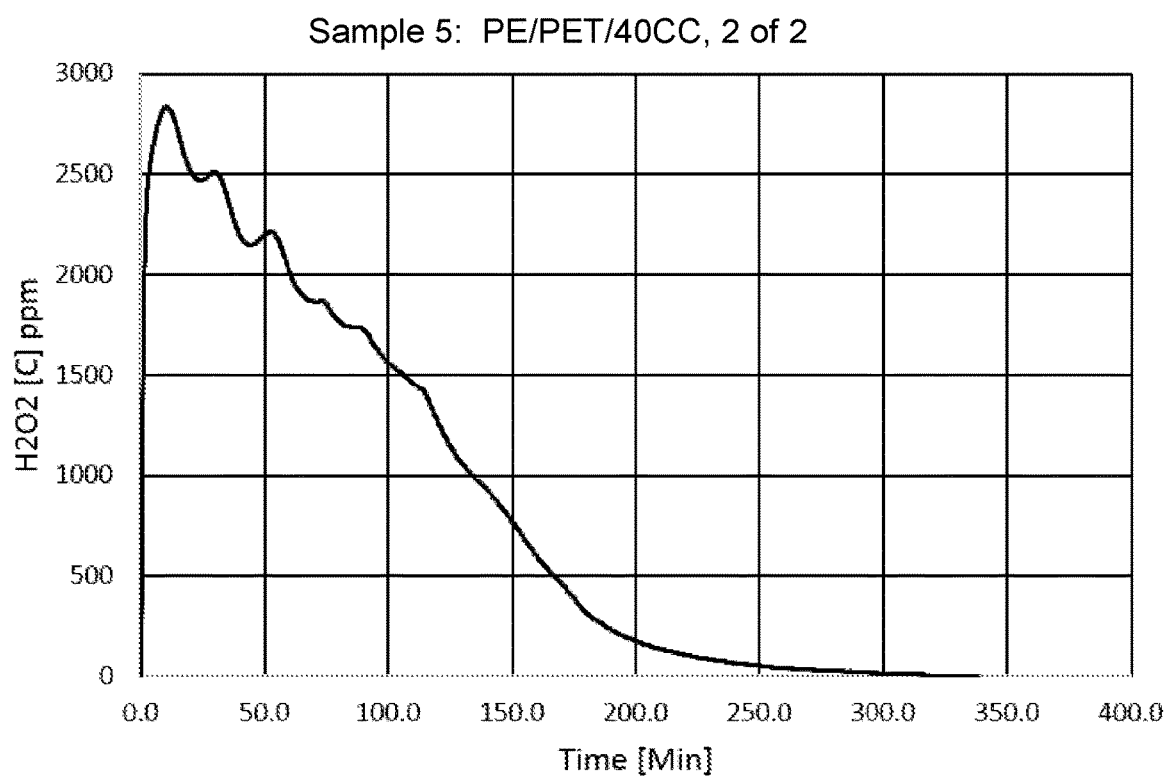
Figure 15:
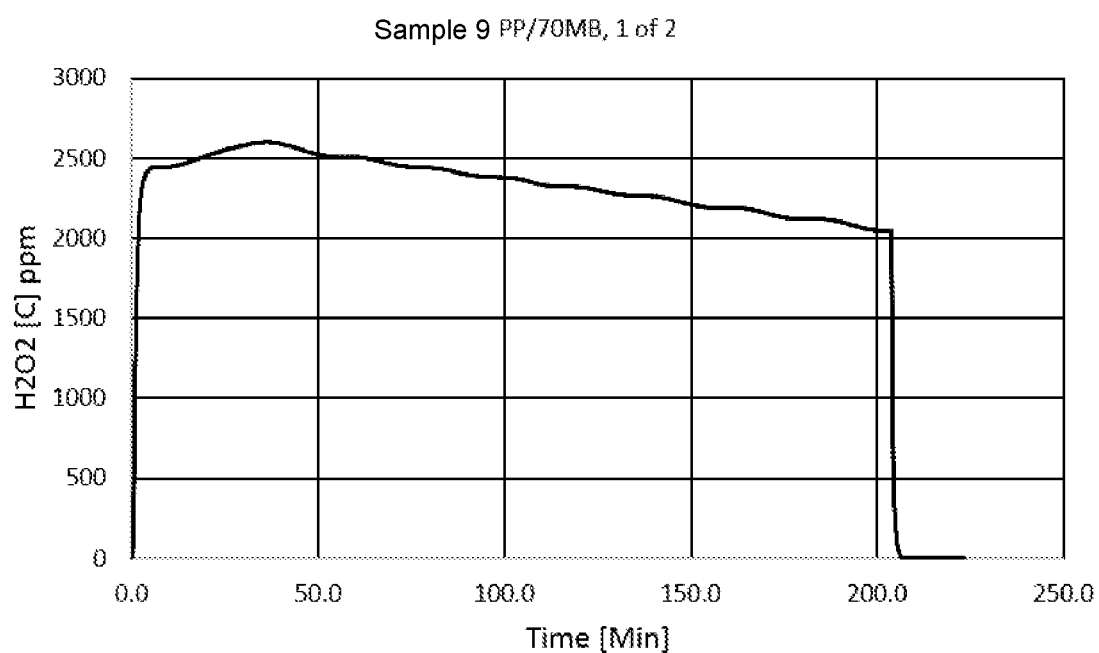
Figure 16:
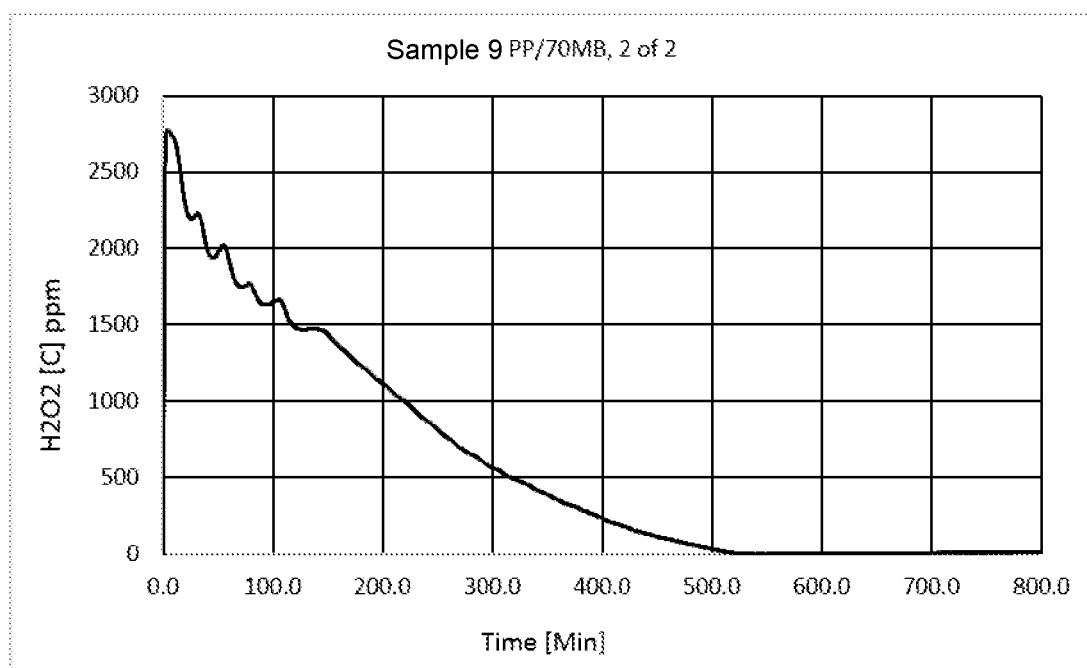
Figure 17:
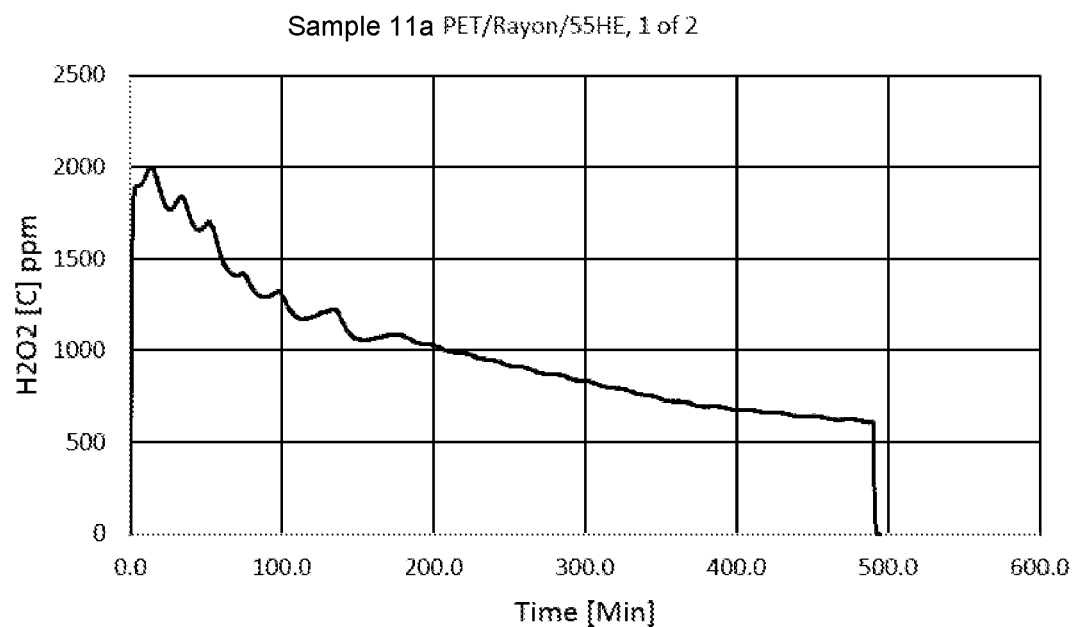
Figure 18:
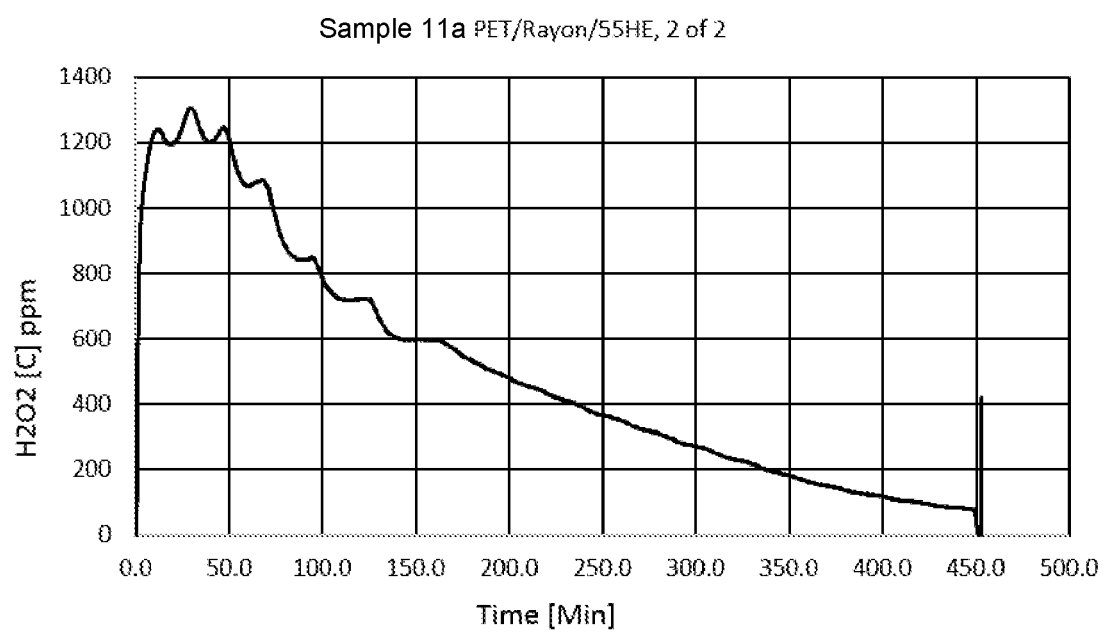

The tests were performed using the exemplary P&ID shown in FIG. 8. HPV (storage device 100) was filled with HP-loaded hydrogel and placed inside the environmental chamber to maintain a constant temperature during each test. Analyzer 1120 was used to measure the HP vapor output during each test.

Figure 21:
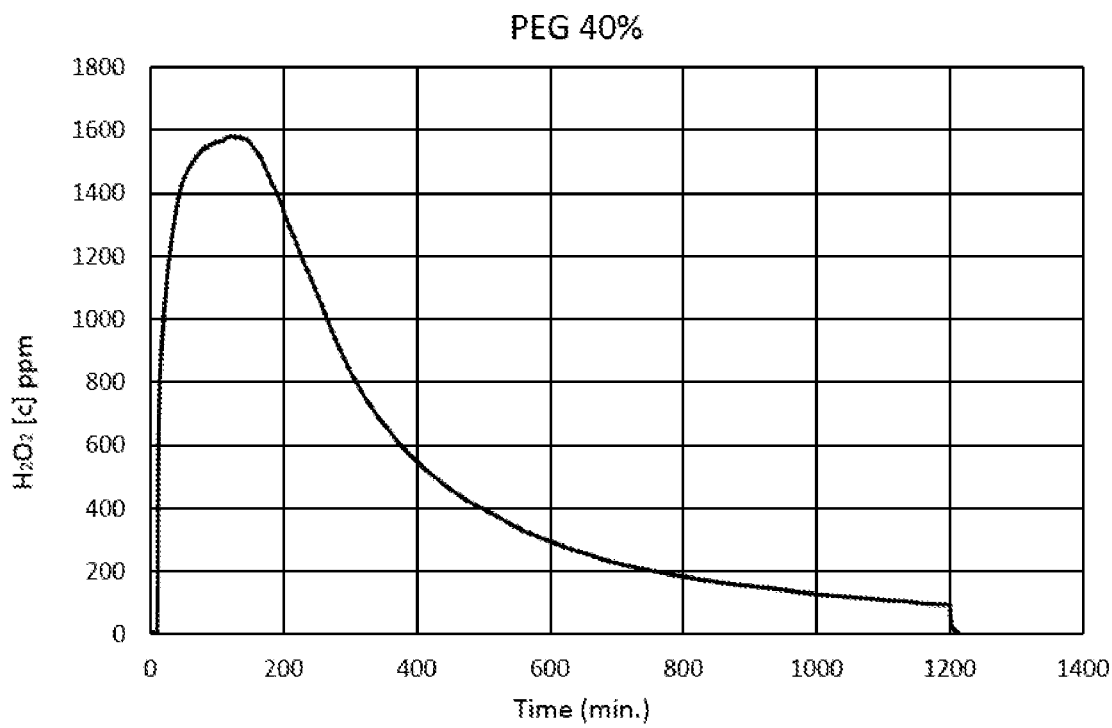
FIGS. 21-23 are graphical diagrams showing hydrogen peroxide vapor output using hydrogel substrates contained in a storage device according to certain embodiments of the disclosure.
Figure 22:
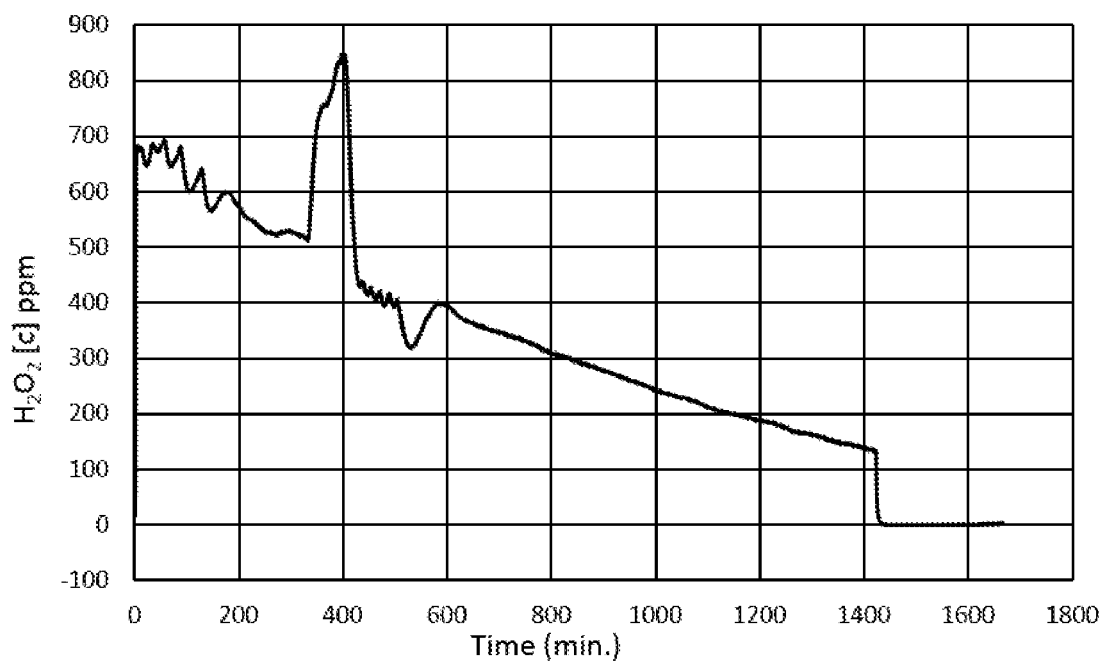
Figure 23:
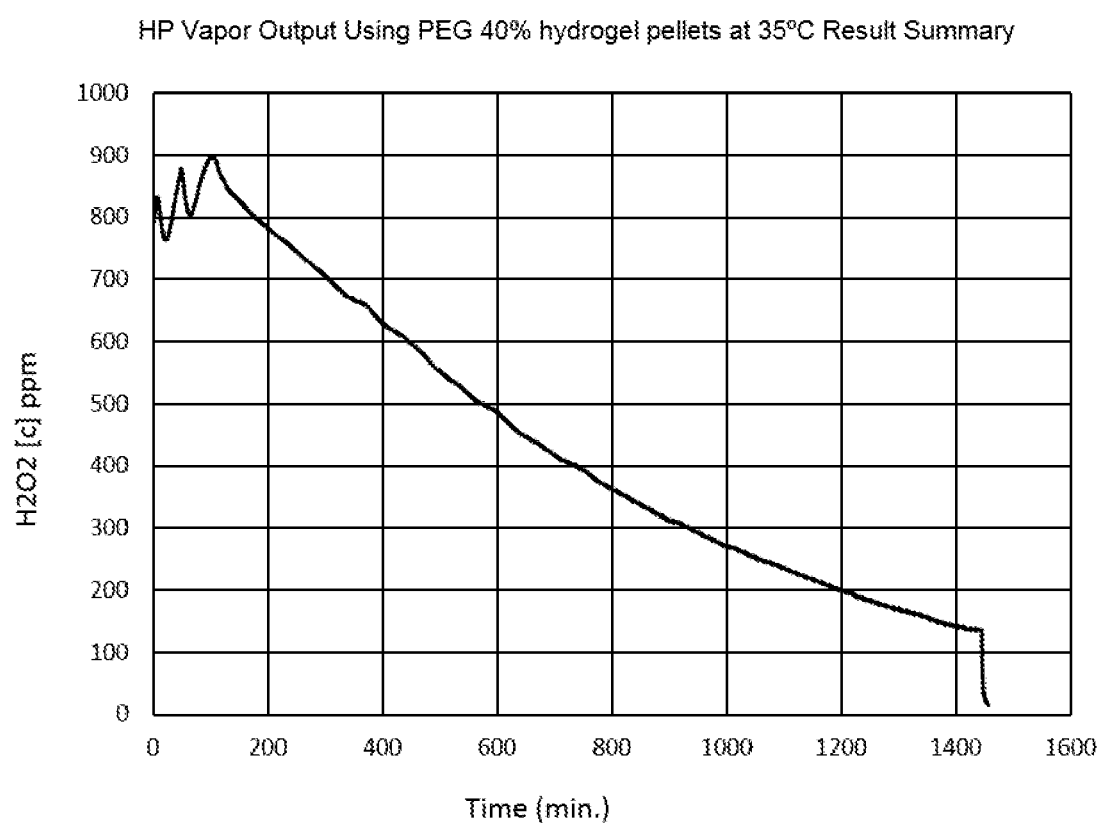

Table 13 summarizes the results of the output tests shown in FIGS. 21, 22, and 23, which correspond to Tests 1, 2, and 3, respectively. The output of hydrogen peroxide in all the samples reached a high level quickly and decreased slowly. As shown in FIG. 23, the 20% PEG hydrogel pellets had a maximum HP vapor output of 849 ppm at 35° C., which occurred 6.6 hours after the test was started. As shown in FIG. 22, the 40% PEG gel had a maximum HP vapor output of 1582 ppm at 35° C., which fell below 1300 ppm after about 210 minutes, which was faster than the 20% hydrogel and the 40% hydrogel pellets. As shown in FIG. 23, the 40% PEG pellets sample had a maximum HP vapor output of 897 ppm at 35° C. The average of the output was calculated from the output between 30 and 300 minute.

After the tests, the PEG gels were weighed again. It was observed that approximately 20% of the hydrogen peroxide was retained in 20% hydrogel, but only 2% was retained in 40% PEG sample.

TABLE 13

Anhydrous Peroxide Vapor Output Summary

| Test | Sample | Run Time (min) | Avg Oven Temperature (° C.) | Avg $H_2O_2$ Flow Rate for Total Run Time (mg/min) | Avg H2O2 Flow Rate by 465 L (mg/min) | Maximum $H_2O_2$ Conc by 465 L (PPM) | Avg $H_2O_2$ Conc by 465 L (PPM) | Mass of $H_2O_2$ retained (g) | Percentage of $H_2O_2$ retained (%) |
|---|---|---|---|---|---|---|---|---|---|
| 1 | 20% PEG pellets | 1423 | 35 | 0.54 | unstable | 849 | unstable | 0.24 | 23.3 |
| 2 | 40% PEG | 1129 | 35 | 0.72 | 1.12 | 1582 | 1502 | 0.02 | 2 |
| 3 | 40% PEG pellets | 1554 | 35 | 0.85 | unstable | 897 | unstalbe | 0.02 | 2 |

Example 5

Testing of Wick Materials with Anhydrous Hydrazine

The purpose this example to determine the compatibility of selected wick materials with anhydrous liquid hydrazine. Four candidate porous adsorbent wick materials were selected: aluminum oxide, activated carbon, hydrophilic PTFE and carbon pyrolyzate.

All sample wick materials were washed and dried. The samples were placed into 50 mL glass vials and submerged in hydrazine. A J-type thermocouple was used to measure the temperature changing of the anhydrous hydrazine. Any visible changes to the wick material and/or hydrazine will were noted during this test.

Figure 6:
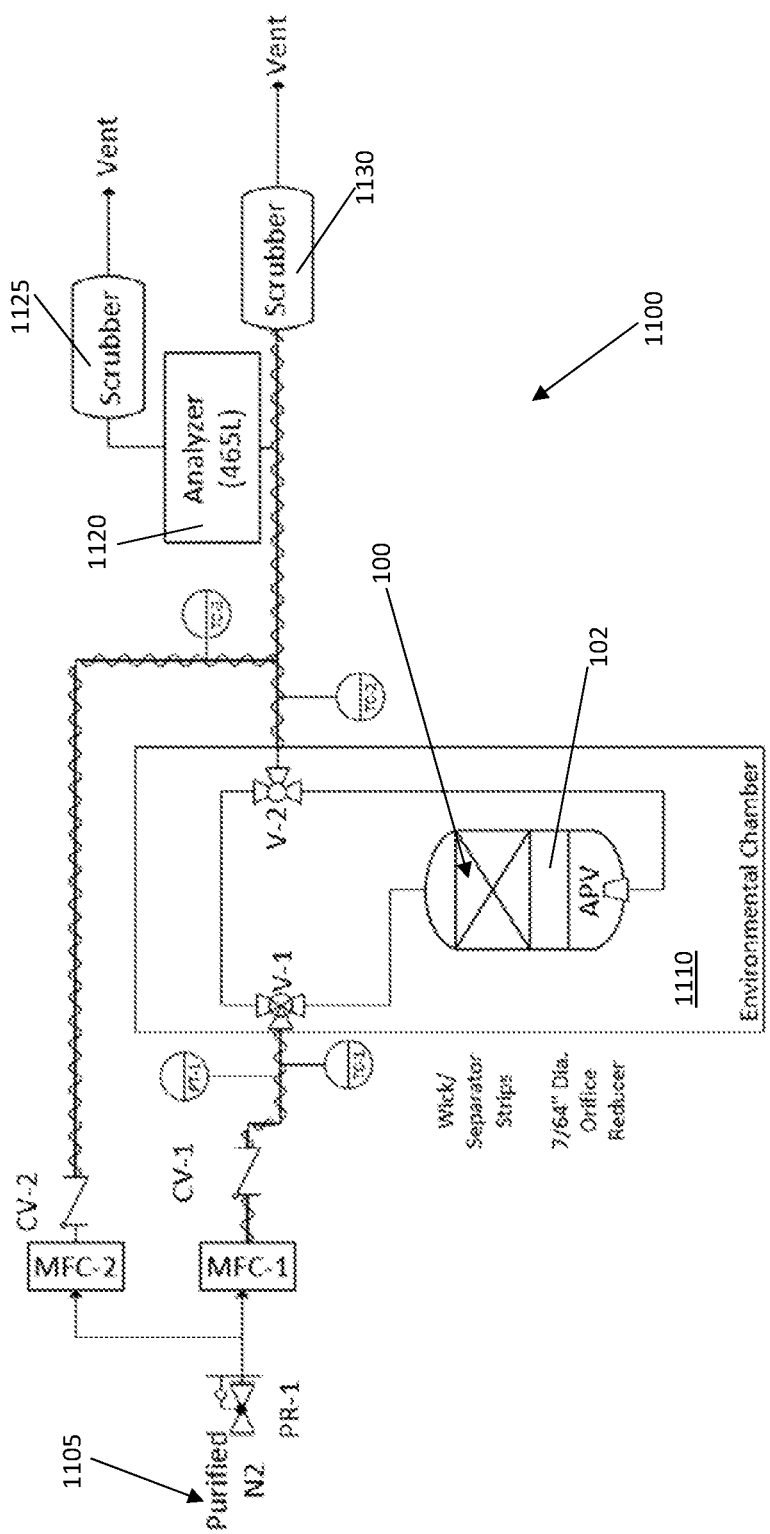
FIG. 6 is a pictorial diagram of a P&ID used for testing according to various embodiments of the present disclosure.
Figure 7:
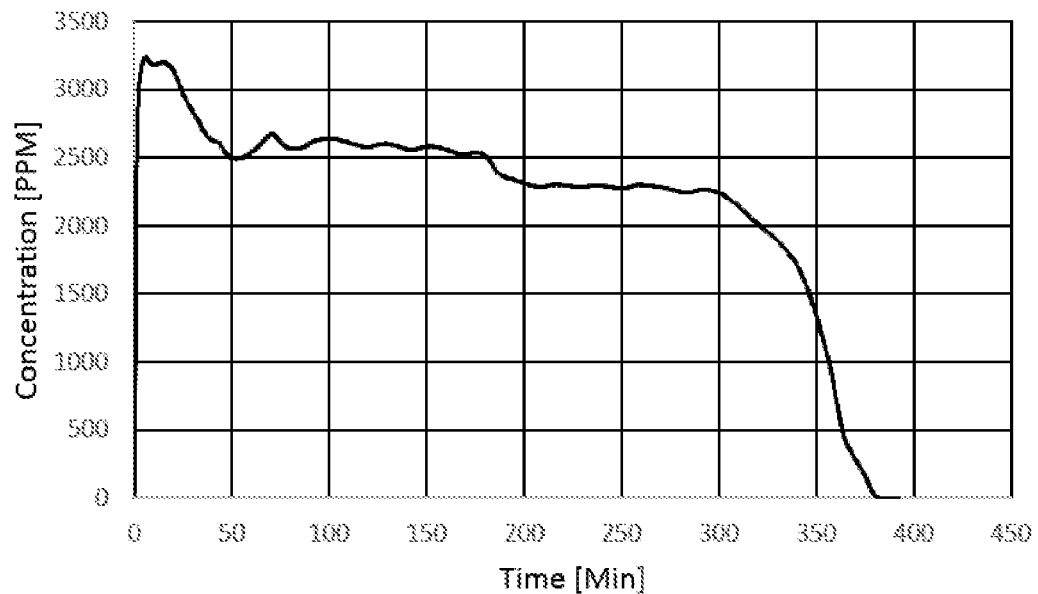
FIGS. 7-18 are graphical diagrams showing vapor concentration outputs of various substrates contained in a storage device according to various embodiments of the present invention.

A test apparatus similar to the one shown in FIG. 6 was used for the hydrazine compatibility tests. Aluminum oxide and activated carbon were tested on day 1, PTFE sheet was tested on day 2, carbon pyrolyzate material was tested on day 3. To minimize the exposure of hydrazine in the glove box, hydrazine in the test vials was decanted into a liquid waste can together on day 4, and a glass pipette was used to remove the rest of hydrazine from the bottom of the vials. Following the tests, the vials with materials were left in the glove box without lids to vaporize the hydrazine before being placed into a solid waste can.

During the activated carbon testing, the temperature increased about 3° C. in short time and the heat release was not sustained. Bubbles were observed, but stopped after about 30 minutes. The sample was inspected after 24 hours, 48 hours and 72 hours, no color change of the hydrazine was observed. After the hydrazine was decanted, there were no observable color or structural changes of the activated carbon.

During the aluminum oxide testing, the temperature increased about 2.5° C. in short time and the heat release was not sustained. Bubbles were observed, but stopped after about 25 minutes. The sample was inspected after 24 hours, 48 hours and 72 hours, and no color change of the hydrazine was observed. After the hydrazine was decanted, there were no observable color or structural changes of the aluminum oxide.

During the carbon pyrolyzate testing, the temperature increased about 2.5° C. after the addition of hydrazine with a steep drop due to the addition of an additional 15 ml of hydrazine. Bubbles were present, but stopped after 1 hour. After 24 hours, no color change of the hydrazine was found. After the hydrazine was decanted, there were no observable color or structural changes of the carbon pyrolyzate material.

During the PTFE sheet testing, the temperature increased about 0.5° C. after the addition of hydrazine. No bubbles were observed. After 24 and 48 hours, no color change of the hydrazine was found. After the hydrazine was decanted, there were no observable color or structural changes of the PTFE sheet.

Although the invention has been described with reference to the above examples, it will be understood that modifications and variations are encompassed within the spirit and scope of the invention. Accordingly, the invention is limited only by the following claims.

What is claimed is:

1. A method for delivering a gas, the method comprising:
   (a) contacting a process solution with a substrate within an enclosed housing such that the solution is adsorbed onto the substrate, thereby diluting the process solution within the substrate and forming a complex;
   (b) exposing the substrate to a carrier gas or a vacuum, thereby forming a gas stream comprising a gas phase of the process solution; and
   (c) delivering the gas stream to a critical process, application, or storage vessel, wherein the process solution is a hydrogen peroxide or a hydrazine, wherein the housing is configured to allow the carrier gas to flow through a head space contained within the housing or is configured to allow vacuum to be drawn through the head space, and wherein the head space is separated from the process solution by the substrate.

2. The method of claim 1, wherein the process solution is a liquid solution or a gaseous solution.

3. The method of claim 1, wherein the process solution is an anhydrous hydrogen peroxide solution, or an anhydrous hydrazine solution.

4. The method of claim 3, wherein the anhydrous hydrogen peroxide solution or anhydrous hydrazine solution contains less than 2% water.

5. The method of claim 1, wherein the substrate is formed from a material selected from the group consisting of titanium dioxide, silicon dioxide, quartz, polytetrafluoroethylene (PTFE), polyester (PE), polyethylene terephthalate (PET), polyethylene/polyethylene terephthalate co-polymer (PE/PET), polypropylene (PP), rayon, zirconium oxide, polymethylpentene (PMP), polybutylene terephthalate (PBT), polyethylene/polypropylene co-polymers, Hydrophilic High Density Polyethylene (HDPE), Hydrophobic High Density Polyethylene (HDPE), Hydrophilic UHMW Polyethylene, Hydrophobic UHMW Polyethlyene, perfluoroalkoxy alkane (PFA), polyvinylidene fluoride (PVF), silk, tencel, sponge materials, polyethylene glycol (PEG), polyvinyl alcohol (PVA), polyvinylpyrrolidone (PVP), polypyridine, polyacrylates, polyacrylic acid, polyacrylic acid/acrylate co-polymers, polycarbonates, polyacrylamides, polyacrylate/acrylamide co-polymers, cellulosic materials, and any combinations thereof.

6. The method of claim 1, wherein the substrate is a porous structure with a surface area ranging from about 100 $m^2/g$ to 1000 $m^2/g$.

7. The method of claim 5, wherein the substrate is configured to adsorb 30% w/w hydrogen peroxide or more.

8. The method of claim 7, wherein the substrate is configured to adsorb over 100% w/w hydrogen peroxide.

9. The method of claim 8, wherein the substrate is configured to adsorb over 1000% w/w hydrogen peroxide.

10. The method of claim 9, wherein the substrate is configured to adsorb over 1900% w/w hydrogen peroxide.

11. The method of claim 1, wherein the housing is provided at a temperature of 0° C. to about 100° C.

12. The method of claim 11, wherein the housing is provided at about 25° C. to 85° C.

13. The method of claim 12, wherein the housing is provided at about 35° C. to 50° C.

14. The method of claim 1, wherein the substrate is formed as a fabric, a powder, one or more bricks, one or more blocks, one or more beads, one or more particles, one or more extrudates, or one or more pellets.

15. The method of claim 14, wherein the substrate is a non-woven fabric that has been treated with a mechanical finishing process selected from the group consisting of spun bonding, needle bonding, perforation bonding, carding, and any combination thereof.

16. The method of claim 14, wherein the substrate is formed as a mesh.

17. The method of claim 16, wherein the mesh is spiral-wound within the housing.

18. The method of claim 17, wherein the housing comprises a separator disposed adjacent to the mesh, wherein the separator is configured to support and separate layers of the spiral-wound mesh.

19. The method of claim 18, wherein the separator is formed from PTFE.

20. The method of claim 1, wherein the substrate is a hydrogel selected from the group consisting of polyethylene glycol (PEG), polyvinyl alcohol (PVA), polyvinylpyrrolidone (PVP), polypyridine, and any combination thereof.

21. The method of claim 20, wherein the hydrogel is wrapped in a PTFE mesh.

22. The method of claim 1, wherein the carrier gas is a substantially dry carrier gas.

23. The method of claim 22, wherein the carrier gas is selected from the group consisting of nitrogen, argon, oxygen, hydrogen, carbon dioxide, clean dry air, helium, ammonia, and any combination thereof.

24. The method of claim 1, wherein the gas stream delivers about 0.10 mg/min to 10 gm/min of the gas phase of the process solution.

25. The method of claim 1, wherein total mass of the process solution in the housing is about 1 gm to 5000 kg.

26. The method of claim 25, wherein the total mass of the process solution in the enclosed chamber is about 300 gm to 1.2 kg.

27. The method of claim 1, wherein the quantity of the process solution in the housing is about 30 to 1900 weight percent of the process solution/substrate complex.

28. The method of claim 27, wherein the quantity of the process solution in the device is about 30 to 800 weight percent of the process solution/substrate complex.

29. The method of claim 28, wherein the quantity of the process solution in the device is about 30 to 100 weight percent of the process solution/substrate complex.

30. The method of claim 4, wherein the anhydrous hydrogen peroxide solution or anhydrous hydrazine solution contains less than 0.5% water.

31. The method of claim 30, wherein the anhydrous hydrogen peroxide solution or anhydrous hydrazine solution contains less than 0.1% water.

32. The method of claim 31, wherein the anhydrous hydrogen peroxide solution or anhydrous hydrazine solution contains less than 0.01% water.

33. The method of claim 1, wherein the hydrazine is selected from the group consisting of mono-methyl hydrazine, tertiary butyl hydrazine, and dimethylhydrazine.

* * * * *